(12) United States Patent
Negoro et al.

(10) Patent No.: US 12,376,410 B2
(45) Date of Patent: Jul. 29, 2025

(54) IMAGING DEVICE WITH EMBEDDED CONDUCTIVE LAYERS

(71) Applicant: Semiconductor Energy Laboratory Co., Ltd., Atsugi (JP)

(72) Inventors: Yusuke Negoro, Kaizuka (JP); Seiichi Yoneda, Isehara (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 404 days.

(21) Appl. No.: 17/621,335

(22) PCT Filed: Jun. 22, 2020

(86) PCT No.: PCT/IB2020/055844
§ 371 (c)(1),
(2) Date: Dec. 21, 2021

(87) PCT Pub. No.: WO2021/001719
PCT Pub. Date: Jan. 7, 2021

(65) Prior Publication Data
US 2022/0320172 A1 Oct. 6, 2022

(30) Foreign Application Priority Data

Jul. 4, 2019 (JP) .................................. 2019-125092
Sep. 11, 2019 (JP) .................................. 2019-165155

(51) Int. Cl.
*H10F 39/00* (2025.01)
*H10F 39/18* (2025.01)

(52) U.S. Cl.
CPC ........... *H10F 39/809* (2025.01); *H10F 39/18* (2025.01); *H10F 39/802* (2025.01);
(Continued)

(58) Field of Classification Search
CPC ......... H01L 27/14634; H01L 27/14603; H01L 27/14621; H01L 27/1463; H01L 27/14643;
(Continued)

(56) References Cited

U.S. PATENT DOCUMENTS 5,501,989 A 3/1996 Takayama et al.
7,495,206 B2 2/2009 Park
(Continued)

FOREIGN PATENT DOCUMENTS

CN 101834194 A 9/2010
CN 105706240 A 6/2016
(Continued)

OTHER PUBLICATIONS

International Search Report (Application No. PCT/IB2020/055844) Dated Sep. 8, 2020.
(Continued)

*Primary Examiner* — Nduka E Ojeh
*Assistant Examiner* — Laura M Dykes
(74) *Attorney, Agent, or Firm* — Eric J. Robinson; Robinson Intellectual Property Law Office, P.C.

(57) ABSTRACT

The present invention relates to a highly functional imaging device that can be manufactured through a small number of steps. A first stacked body is formed in which a circuit provided with a transistor including a metal oxide in its channel formation region (hereinafter, OS transistor) is stacked over a circuit including a Si transistor. A second stacked body is formed in which an OS transistor is provided over a Si photodiode. Layers including the OS transistors of the first stacked body and the second stacked body are bonded to each other to obtain electrical connection between circuits. With such a structure, even when a structure is employed in which a plurality of circuits having different
(Continued)

functions are stacked, the number of polishing steps and bonding steps can be reduced, improving the yield.

20 Claims, 24 Drawing Sheets

(52) U.S. Cl.
CPC ..... *H10F 39/8053* (2025.01); *H10F 39/8057* (2025.01); *H10F 39/807* (2025.01)

(58) Field of Classification Search
CPC ............... H01L 27/06; H01L 27/14605; H01L 27/14609; H01L 27/14627; H01L 27/14612
USPC .......................................................... 257/431
See application file for complete search history.

(56) References Cited

U.S. PATENT DOCUMENTS

| | | | |
|---|---|---|---|
| 7,674,650 B2 | 3/2010 | Akimoto et al. |
| 7,701,029 B2 | 4/2010 | Mabuchi |
| 7,812,874 B2 | 10/2010 | Iwabuchi et al. |
| 8,314,870 B2 | 11/2012 | Itonaga et al. |
| 8,378,341 B2 | 2/2013 | Hayashi et al. |
| 8,378,391 B2 | 2/2013 | Koyama et al. |
| 8,440,954 B2 | 5/2013 | Masaaki |
| 8,466,403 B2 | 6/2013 | Endo et al. |
| 8,629,524 B2 | 1/2014 | Wang et al. |
| 8,669,602 B2 | 3/2014 | Hayashi |
| 8,735,263 B2 | 5/2014 | Yamazaki et al. |
| 8,749,679 B2 | 6/2014 | Shinohara |
| 8,772,130 B2 | 7/2014 | Ohki |
| 8,928,795 B2 | 1/2015 | Kusaka |
| 9,093,575 B2 | 7/2015 | Yokoyama |
| 9,123,529 B2 | 9/2015 | Hanaoka et al. |
| 9,136,141 B2 | 9/2015 | Koezuka |
| 9,293,496 B2 | 3/2016 | Kashihara |
| 9,349,766 B2 | 5/2016 | Sugiura |
| 9,356,061 B2 | 5/2016 | Fan et al. |
| 9,473,714 B2 | 10/2016 | Aoki et al. |
| 9,502,450 B2 | 11/2016 | Yanagita et al. |
| 9,543,356 B2 | 1/2017 | Gambino et al. |
| 9,553,120 B2 | 1/2017 | Park et al. |
| 9,748,291 B2 | 8/2017 | Ikeda et al. |
| 9,842,875 B2 | 12/2017 | Fan et al. |
| 9,905,598 B2 | 2/2018 | Yamazaki et al. |
| 9,978,774 B2 | 5/2018 | Yamazaki et al. |
| 10,020,336 B2 | 7/2018 | Ikeda et al. |
| 10,090,022 B2 | 10/2018 | Shionoiri et al. |
| 10,367,005 B2 | 7/2019 | Yamazaki et al. |
| 10,879,293 B2 | 12/2020 | Furuhashi |
| 11,222,912 B2 | 1/2022 | Furukawa et al. |
| 11,901,382 B2 | 2/2024 | Furukawa et al. |
| 2010/0230729 A1 | 9/2010 | Ellis-Monaghan et al. |
| 2011/0101333 A1 | 5/2011 | Shionoiri et al. |
| 2012/0104523 A1 | 5/2012 | Ikeda |
| 2013/0285046 A1 | 10/2013 | Yamazaki |
| 2015/0035028 A1 | 2/2015 | Fan et al. |
| 2015/0162371 A1 | 6/2015 | Fujii et al. |
| 2015/0171050 A1* | 6/2015 | Chen .................... H01L 27/1464 257/784 |
| 2015/0255490 A1* | 9/2015 | Miyairi ............... H01L 29/7869 257/43 |
| 2015/0263053 A1 | 9/2015 | Yamazaki et al. |
| 2015/0279884 A1 | 10/2015 | Kusumoto |
| 2015/0349129 A1 | 12/2015 | Ikeda |
| 2016/0118425 A1 | 4/2016 | Kurokawa |
| 2016/0133660 A1 | 5/2016 | Inoue et al. |
| 2016/0225808 A1 | 8/2016 | Kurokawa |
| 2016/0366360 A1* | 12/2016 | Okamoto ............... H04N 5/147 |
| 2017/0221943 A1* | 8/2017 | Yamazaki ......... H01L 27/14636 |
| 2018/0005668 A1 | 1/2018 | Shionoiri et al. |
| 2019/0386052 A1 | 12/2019 | Furuhashi |
| 2021/0151486 A1 | 5/2021 | Kobayashi et al. |
| 2021/0375966 A1* | 12/2021 | Baba ................. H01L 27/14609 |
| 2024/0096914 A1 | 3/2024 | Furukawa et al. |

FOREIGN PATENT DOCUMENTS

| | | |
|---|---|---|
| CN | 110073492 A | 7/2019 |
| CN | 110870299 A | 3/2020 |
| DE | 112017006410 | 8/2019 |
| JP | 2010-212668 A | 9/2010 |
| JP | 2011-119711 A | 6/2011 |
| JP | 2016-534557 | 11/2016 |
| JP | 2018-011294 A | 1/2018 |
| JP | 2018-085402 A | 5/2018 |
| JP | 2018-101699 A | 6/2018 |
| KR | 2010-0102043 A | 9/2010 |
| KR | 2016-0033231 A | 3/2016 |
| KR | 2018-0003432 A | 1/2018 |
| TW | 201515202 | 4/2015 |
| TW | 201735130 | 10/2017 |
| TW | 201812748 | 4/2018 |
| WO | WO-2015/020821 | 2/2015 |
| WO | WO-2017/137864 | 8/2017 |
| WO | WO-2018/096980 | 5/2018 |
| WO | WO-2018/116559 | 6/2018 |
| WO | WO-2019/012370 | 1/2019 |

OTHER PUBLICATIONS

Written Opinion (Application No. PCT/IB2020/055844) Dated Sep. 8, 2020.

Taiwanese Office Action (Application No. 109121768) dated Mar. 26, 2024.

* cited by examiner 1.2 μm 1.3 μm 1.2 μm 1.3 μm

FIG. 8A
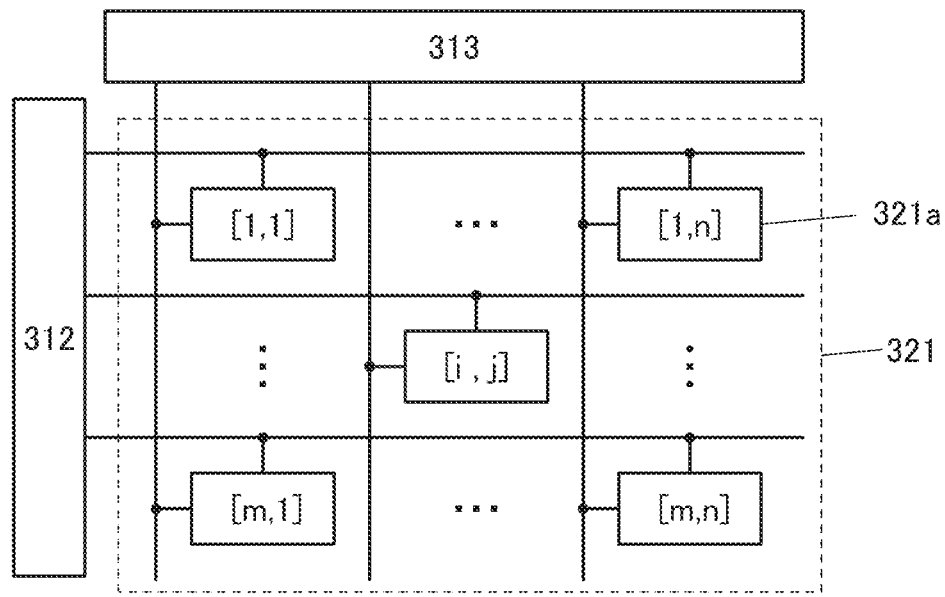
FIG. 8B 321aA
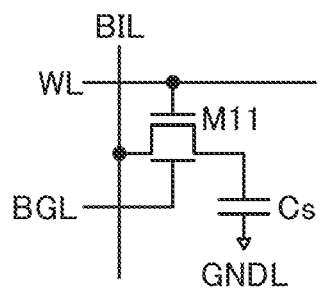
FIG. 8C 321aB
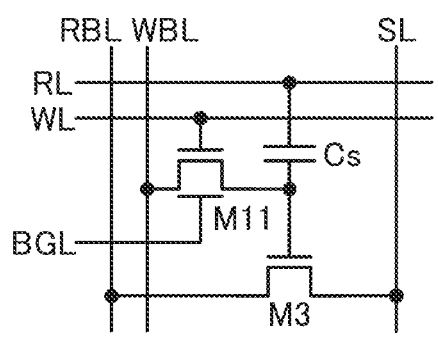
FIG. 8D 321aC
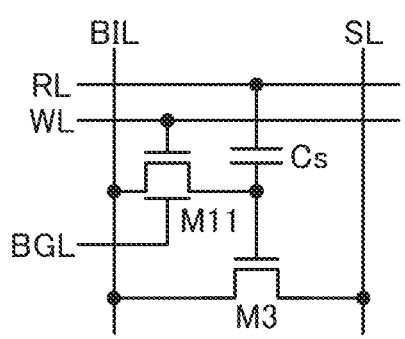
FIG. 8E 321aD
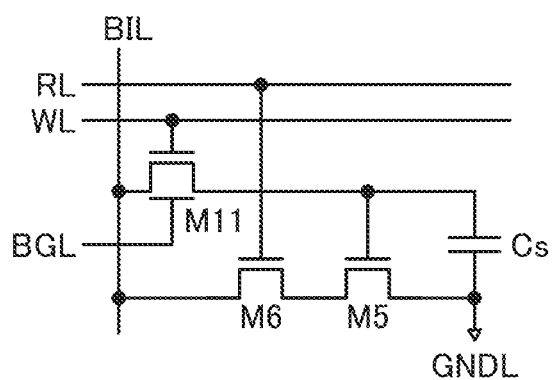

FIG. 9A

| Line[1] | Rn-1 | En | | Rn | En+1 | |
|---|---|---|---|---|---|---|
| Line[2] | En-1 | Rn-1 | En | | Rn | En+1 |
| Line[3] | En-1 | | Rn-1 | En | | Rn | En+1 |
| Line[M] | En-1 | | Rn-1 | En | | Rn |

FIG. 9B

| Line[1] | En | Rn | | | En+1 |
|---|---|---|---|---|---|
| Line[2] | En | | Rn | | En+1 |
| Line[3] | En | | | Rn | En+1 |
| Line[M] | En | | | Rn | En+1 |

FIG. 23A1
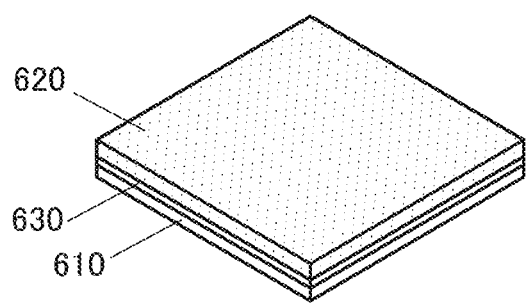
FIG. 23B1
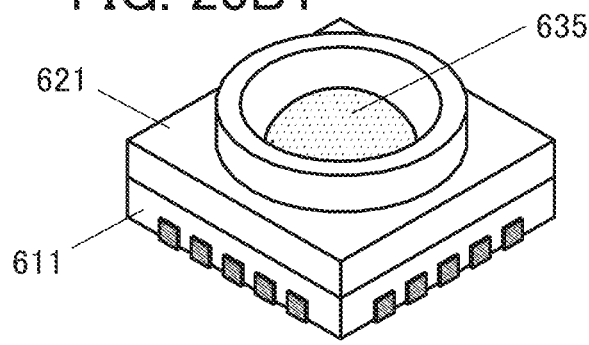
FIG. 23A2
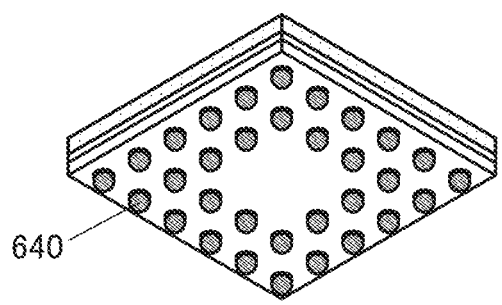
FIG. 23B2
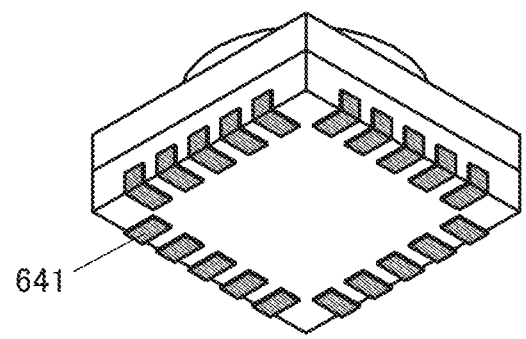
FIG. 23A3
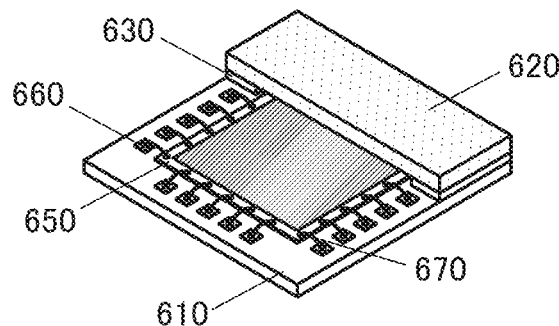
FIG. 23B3
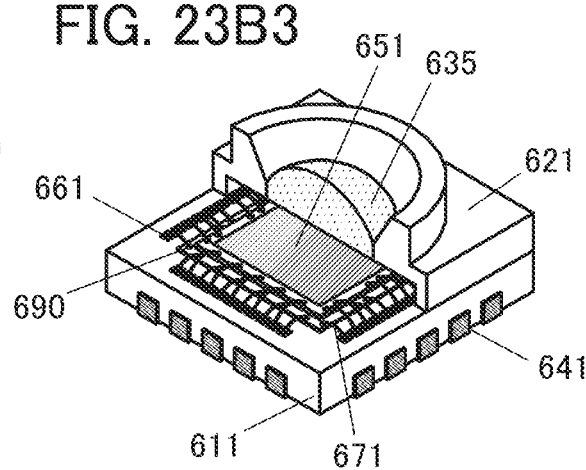

IMAGING DEVICE WITH EMBEDDED CONDUCTIVE LAYERS

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

REFERENCE

Patent Document

[Patent Document 1] Japanese Published Patent Application No. 2011-119711

SUMMARY OF THE INVENTION

Problems to be Solved by the Invention

With the technological development, a high-quality image can be easily captured with an imaging device such as a CMOS image sensor. In the next generation, an imaging device is required to be more highly functional.

In contrast, an imaging device is also required to reduce its size because the imaging device is incorporated into a variety of devices. Thus, even in the case where a function is added, a sensor chip is desired to be miniaturized. Accordingly, a component to add a function to an imaging device is preferably provided to be stacked.

However, in the case where a plurality of devices or the like using silicon semiconductors (hereinafter, Si devices) are stacked, a polishing step, a bonding step, and the like are required to be performed a plurality of times. Thus, improvement in the yield is a challenge.

In view of the above, an object of one embodiment of the present invention is to provide a highly functional imaging device. Another object is to provide a small imaging device. Another object is to provide an imaging device or the like capable of high-speed operation. Another object is to provide an imaging device with high reliability. Another object is to provide a novel imaging device or the like. Another object is to provide a method for driving the above imaging device. Another object is to provide a novel semiconductor device or the like.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention relates to an imaging device having a stacked-layer structure.

One embodiment of the present invention is an imaging device including a first circuit, a second circuit, a third circuit, a photoelectric conversion device, a first insulating layer, a second insulating layer, a third insulating layer, a fourth insulating layer, a first conductive layer, and a second conductive layer. The first circuit includes a region overlapping with the second insulating layer with the first insulating layer and the second circuit therebetween. The first insulating layer is provided between the first circuit and the second circuit. The first conductive layer includes a region embedded in the second insulating layer. The photoelectric conversion device includes a region overlapping with the fourth insulating layer with the third insulating layer and the third circuit therebetween. The third insulating layer is provided between the photoelectric conversion device and the third circuit. The second conductive layer includes a region embedded in the fourth insulating layer. The first conductive layer is electrically connected to the first circuit. The first circuit is electrically connected to the second circuit. The second conductive layer is electrically connected to the third circuit. The third circuit is electrically connected to the photoelectric conversion device. The first conductive layer and the second conductive layer are directly bonded to each other. The second insulating layer and the fourth insulating layer are directly bonded to each other.

The first circuit preferably includes a transistor including silicon in its channel formation region. The second circuit and the third circuit preferably each include a transistor including a metal oxide in its channel formation region. The photoelectric conversion device is preferably a photodiode including silicon in its photoelectric conversion layer. It is preferable that the metal oxide include In, Zn, and M (M is one or more of Al, Ti, Ga, Ge, Sn, Y, Zr, La, Ce, Nd, and Hf).

The first conductive layer and the second conductive layer are preferably formed using the same metal material, and the second insulating layer and the fourth insulating layer are preferably formed using the same insulating material.

The third circuit and the photoelectric conversion device can function as a pixel circuit, and the first circuit can function as a reading circuit of the pixel circuit.

A light-blocking layer may be further included. The light-blocking layer can be provided between the photoelectric conversion device and the third circuit.

A fourth circuit and a fifth circuit can be further included. The fourth circuit and the fifth circuit can be provided over the same substrate as the first circuit. The fourth circuit can be electrically connected to the second circuit. The fifth circuit can be electrically connected to the second circuit.

The fourth circuit and the fifth circuit preferably each include a transistor including silicon in its channel formation region.

The second circuit can function as a memory circuit. The fourth circuit can function as a column driver for driving the memory circuit. The fifth circuit can function as a row driver for driving the memory circuit.

The third circuit can include a first transistor, a second transistor, a third transistor, a fourth transistor, a fifth transistor, and a capacitor. One of a source and a drain of the first transistor can be electrically connected to one electrode of the photoelectric conversion device. The other of the source and the drain of the first transistor can be electrically connected to one of a source and a drain of the second transistor and one of a source and a drain of the third transistor. The other of the source and the drain of the third transistor can be electrically connected to a gate of the fourth transistor and one electrode of the capacitor. One of a source and a drain of the fourth transistor can be electrically connected to one of a source and a drain of the fifth transistor.

The first transistor, the second transistor, the fourth transistor, and the fifth transistor can each be a transistor including silicon in its channel formation region. The third transistor can be a transistor including a metal oxide in its channel formation region. It is preferable that the metal oxide include In, Zn, and M (M is one or more of Al, Ti, Ga, Ge, Sn, Y, Zr, La, Ce, Nd, and Hf).

Effect of the Invention

With the use of one embodiment of the present invention, a highly functional imaging device can be provided. An imaging device that can be manufactured through a small number of steps can be provided. An imaging device that can be manufactured with a high yield can be provided. A small imaging device can be provided. An imaging device or the like capable of high-speed operation can be provided. An imaging device with high reliability can be provided. A novel imaging device or the like can be provided. A method for driving the above imaging device can be provided. A novel semiconductor device or the like can be provided.

BRIEF DESCRIPTION OF THE DRAWINGS

FIG. 8A is a block diagram illustrating a memory circuit. FIG. 8B to FIG. 8E are circuit diagrams illustrating memory cells.

FIG. 9A is a diagram showing a rolling shutter operation. FIG. 9B is a diagram showing a global shutter operation.

FIG. 23A1 to FIG. 23A3 and FIG. 23B1 to FIG. 23B3 are perspective views of a package in which an imaging device is placed and a module in which an imaging device is placed.

MODE FOR CARRYING OUT THE INVENTION

Figure 1:
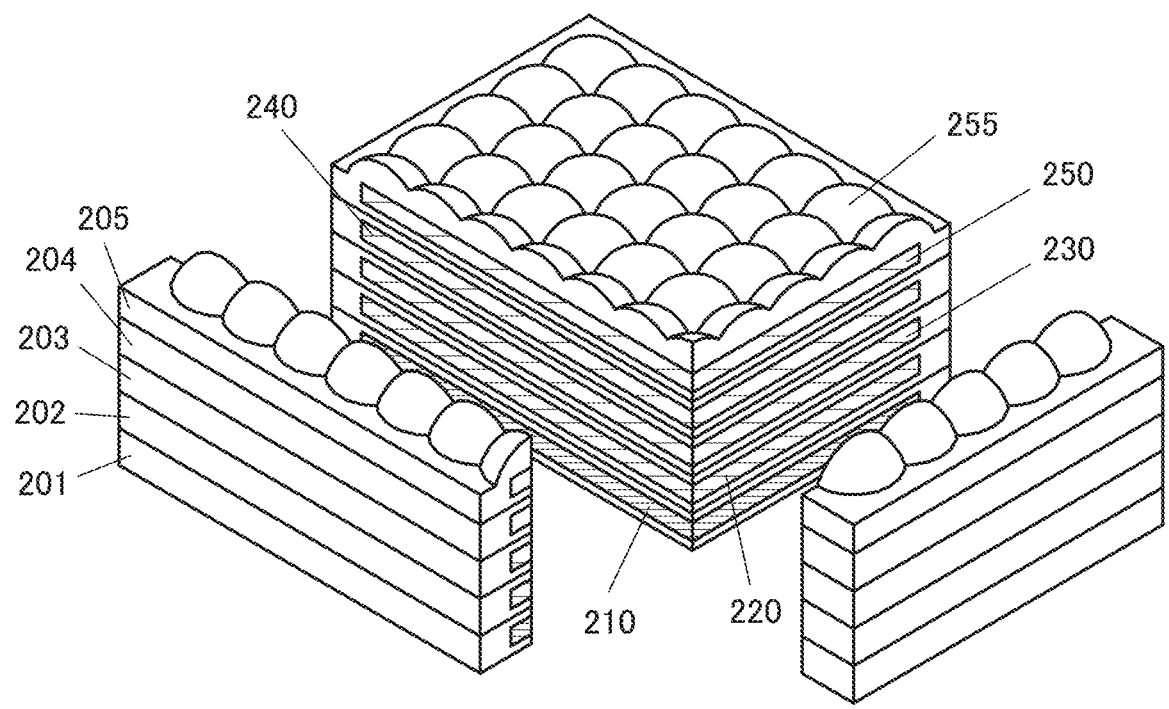
FIG. 1 is a cross-sectional perspective view illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through one conductor or a plurality of conductors. In this specification, even such a configuration is included in direct connection.

Embodiment 1

In this embodiment, an imaging device of one embodiment of the present invention is described with reference to drawings.

One embodiment of the present invention is an imaging device including a plurality of stacked devices. The imaging device is formed in such a manner that a first stacked body in which a plurality of devices are stacked and a second stacked body in which a plurality of devices are stacked are bonded to each other. Thus, even when a structure is employed in which a plurality of circuits having different functions are stacked, the number of polishing steps and bonding steps can be reduced, improving the yield.

For example, a pixel circuit, a driver circuit of a pixel, and the like can be provided in the first stacked body, and a reading circuit of the pixel circuit, a memory circuit, a driver circuit of the memory circuit, and the like can be provided in the second stacked body. With these structures, the imaging device which is small can be formed. Furthermore, wiring delay or the like can be prevented by stacking circuits, so that high-speed operation can be performed.

<Stacked-Layer Structure>

FIG. 1 is a cross-sectional perspective view illustrating an imaging device of one embodiment of the present invention. The imaging device includes a layer 201, a layer 202, a layer 203, a layer 204, and a layer 205.

Although the description is made in which the imaging device is divided into the five layers for clarity of the description in this embodiment, the kind, number, and position of components included in each layer are not limited to those described in this embodiment. For example, a component, such as an insulating layer, a wiring, or a plug, which is positioned near the boundary between the layers is sometimes positioned in a layer different from the layer described in this embodiment. Furthermore, each layer may include a component that is different from the component described in this embodiment.

The layer 201 includes a region 210. A reading circuit of a pixel circuit, a driver circuit of a memory circuit, and the like can be provided in the region 210, for example.

The layer 202 includes a region 220. The memory circuit and the like can be provided in the region 220, for example.

The layer 203 includes a region 230. The pixel circuit (except a photoelectric conversion device 240), a driver circuit of the pixel circuit, and the like can be provided in the region 230, for example.

The layer 204 includes the photoelectric conversion device 240. As the photoelectric conversion device 240, a photodiode can be used, for example. Note that the photoelectric conversion device 240 is a component of the pixel circuit.

The layer 205 includes an optical conversion layer 250. As the optical conversion layer 250, a color filter can be used, for example. The layer 205 can include a microlens array 255.

As described above, the imaging device of one embodiment of the present invention includes the photoelectric conversion device 240, the pixel circuit and the driver circuit of the pixel circuit provided in the region 230, the memory circuit provided in the region 220, the reading circuit of the pixel circuit and the driver circuit of the memory circuit provided in the region 210, and the like.

Here, the photoelectric conversion device 240 preferably has sensitivity to visible light. For example, a Si photodiode that uses silicon in its photoelectric conversion layer can be used as the photoelectric conversion device 240.

As components of the pixel circuit, the driver circuit of the pixel circuit, and the like, transistors each including a metal oxide in a channel formation region (hereinafter, OS transistors) are preferably used. The OS transistor has an extremely low off-state current and can suppress unnecessary data leakage from the pixel circuit. Therefore, the global shutter operation in which data are obtained in a plurality of pixel circuits at once and are sequentially read out can be realized with a simple circuit structure. In addition, the driver circuit of a pixel and the pixel circuit can be formed through common steps.

It is preferable to use an OS transistor also in the memory circuit. The use of the OS transistor as a cell transistor in the memory circuit can suppress unnecessary data leakage and decrease the frequency of refresh operation. Accordingly, power consumption can be reduced.

High-speed operation is required for the reading circuit of the pixel circuit, the driver circuit of the memory circuit, and the like; thus, transistors with a high mobility are preferably used in these circuits. For example, transistors using silicon in channel formation regions (hereinafter, Si transistors) are preferably used. Examples of the Si transistor include a transistor including amorphous silicon and a transistor including crystalline silicon (microcrystalline silicon, low-temperature polysilicon, or single crystal silicon). Note that the driver circuit of the pixel circuit may be formed using a Si transistor.

In the case where a plurality of Si devices are stacked, a polishing step and a bonding step are required to be performed a plurality of times. Consequently, there are issues such as a large number of manufacturing steps, the need for a dedicated apparatus, and a low yield, and the manufacturing cost is high. In one embodiment of the present invention, a circuit using an OS transistor is formed over a Si device, whereby the number of polishing steps and the bonding steps can be reduced.

An OS transistor can be formed over a Si device (Si transistor, Si photodiode) with an insulating layer therebetween without a complicated step such as bonding or bump bonding.

Figure 2A:
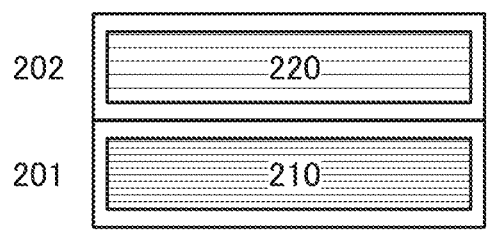
FIG. 2A to FIG. 2C are diagrams illustrating a method for forming a stacked body.

Accordingly, in one embodiment of the present invention, the layer 201 is a layer including a silicon substrate, and a circuit including a Si transistor is formed in the region 210. Then, as illustrated in FIG. 2A, the layer 202 is formed over the layer 201. A circuit including an OS transistor is formed in the region 220 of the layer 202.

Figure 2B:
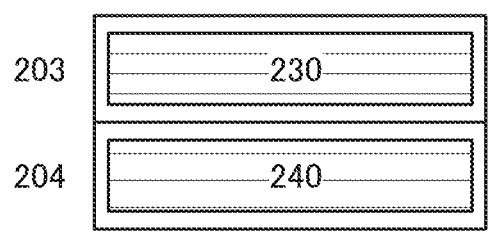

The layer 204 is a layer including a silicon substrate, and a Si photodiode is formed as the photoelectric conversion device 240 in the layer 204. Then, as illustrated in FIG. 2B, the layer 203 is formed over the layer 204. A circuit including an OS transistor is formed in the region 230 of the layer 203.

Figure 2C:
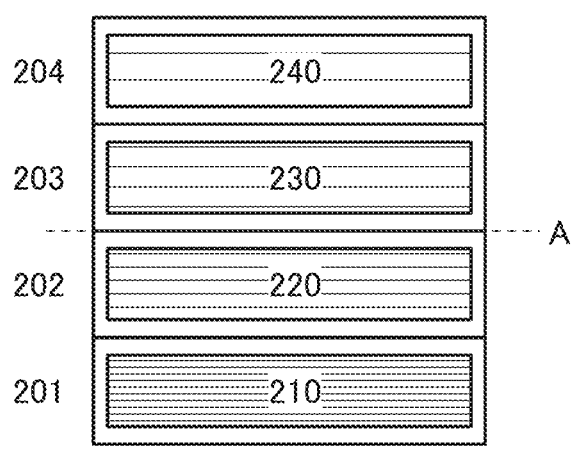

Then, as illustrated in FIG. 2C, the layer 202 and the layer 203 are attached to each other at a plane A, whereby a stacked-layer structure in which the layer 201 to the layer 204 overlap with one another can be manufactured. FIG. 1 illustrates a structure in which the layer 205 is further provided over the layer 204 of the stacked body in FIG. 2C.

In the case where Si devices are stacked, a polishing step and a bonding step are each required to be performed at least about three times in stacking four layers. However, in one embodiment of the present invention, one or two polishing steps and one bonding step are needed.

<Circuit>

Figure 3A:
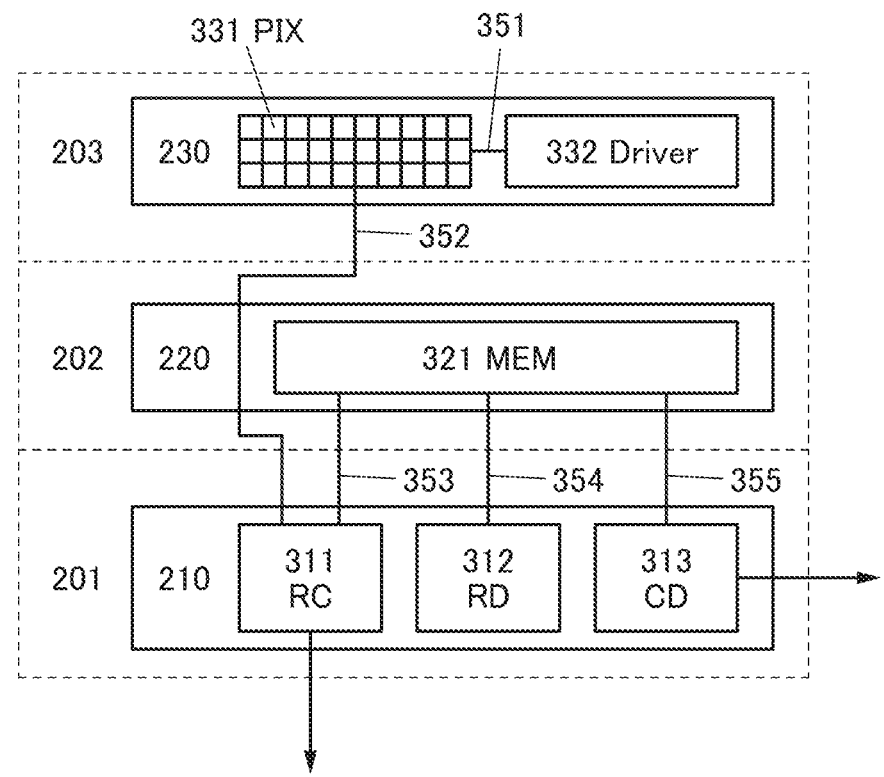
FIG. 3A and FIG. 3B are block diagrams illustrating an imaging device.

FIG. 3A is a simple block diagram illustrating electrical connection between components included in the layers 201 to 203. Note that the photoelectric conversion device 240 included in the layer 204 is included in a pixel circuit 331 (PIX) in terms of the circuit structure and thus is not illustrated here.

The pixel circuits 331 are provided in a matrix and are electrically connected to a driver circuit 332 (Driver) through a wiring 351. The driver circuit 332 can control data acquisition operation, selection operation, and the like of the pixel circuit 331. For the driver circuit 332, a shift register or the like can be used, for example.

Moreover, the pixel circuit 331 is electrically connected to a reading circuit 311 (RC) through a wiring 352. The reading circuit 311 includes a correlated double sampling circuit (CDS circuit) for reducing noise and an A/D converter for converting analog data into digital data.

The reading circuit 311 is electrically connected to a memory circuit 321 (MEM) through a wiring 353. The memory circuit 321 can retain digital data output from the reading circuit 311. Alternatively, digital data can be output directly to the outside from the reading circuit 311.

The memory circuit 321 is electrically connected to a row driver 312 (RD) through a wiring 354. In addition, the memory circuit 321 is electrically connected to a column driver 313 (CD) through a wiring 355. The row driver 312 is a driver circuit of the memory circuit 321 and can control data writing and reading. The column driver 313 is a driver circuit of the memory circuit 321 and can control data reading.

Figure 3B:
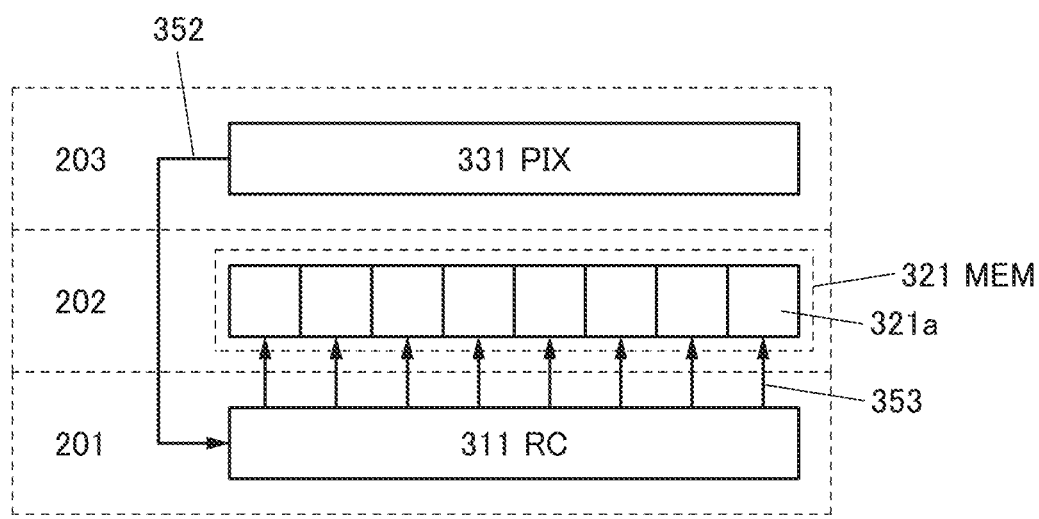

The details of the connection relation between the pixel circuit 331, the reading circuit 311, and the memory circuit 321 are described with reference to a block diagram of FIG. 3B. The number of reading circuits 311 can be equal to the number of the pixel circuits 331, and one reading circuit 311 is electrically connected to one pixel circuit 331 through the wiring 352. The reading circuit 311 is connected to the plurality of wirings 353, and each of the wirings 353 is electrically connected to one memory cell 321*a*. Note that a data retention circuit may be provided between the reading circuit 311 and the memory circuit 321.

The A/D converter included in the reading circuit 311 outputs binary data of a predetermined number of bits in parallel. Accordingly, the A/D converter is connected to the memory cells 321*a* of the predetermined number of bits. For example, when an output of the A/D converter is 8 bits, the A/D converter is connected to eight memory cells 321*a*.

In the imaging device of one embodiment of the present invention with the above structure, the A/D conversion of the analog data obtained in all of the pixel circuits 331 can be performed in parallel, and the converted digital data can be directly written to the memory circuit 321. In other words, operations from imaging to data storing in the memory circuit can be performed at high speed. In addition, the imaging operation, the A/D conversion operation, and the reading operation can be performed in parallel.

<Pixel Circuit>

Figure 4A:
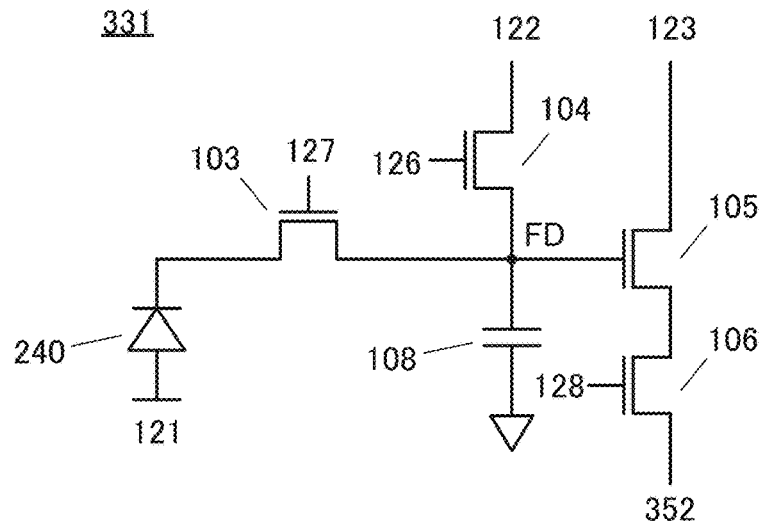
FIG. 4A to FIG. 4C are circuit diagrams illustrating pixel circuits.

FIG. 4A is a circuit diagram illustrating an example of the pixel circuit 331. The pixel circuit 331 can include the photoelectric conversion device 240, a transistor 103, a transistor 104, a transistor 105, a transistor 106, and a capacitor 108. Note that the capacitor 108 is not necessarily provided.

One electrode (cathode) of the photoelectric conversion device 240 is electrically connected to one of a source and a drain of the transistor 103. The other of the source and the drain of the transistor 103 is electrically connected to one of a source and a drain of the transistor 104. The one of the source and the drain of the transistor 104 is electrically connected to one electrode of the capacitor 108. The one electrode of the capacitor 108 is electrically connected to a gate of the transistor 105. One of a source and a drain of the transistor 105 is electrically connected to one of a source and a drain of the transistor 106.

Here, a wiring that connects the other of the source and the drain of the transistor 103, the one electrode of the capacitor 108, and the gate of the transistor 105 is a node FD. The node FD can function as a charge detection portion.

The other electrode (anode) of the photoelectric conversion device 240 is electrically connected to a wiring 121. A gate of the transistor 103 is electrically connected to a wiring 127. The other of the source and the drain of the transistor 104 is electrically connected to a wiring 122. The other of the source and the drain of the transistor 105 is electrically connected to a wiring 123. A gate of the transistor 104 is electrically connected to a wiring 126. A gate of the transistor 106 is electrically connected to a wiring 128. The other electrode of the capacitor 108 is electrically connected to a reference potential line such as a GND wiring, for example. The other of the source and the drain of the transistor 106 is electrically connected to the wiring 352.

The wirings 127, 126, and 128 can function as signal lines that control the conduction of the transistors. The wiring 352 can function as an output line.

The wirings 121, 122, and 123 can function as power supply lines. The structure illustrated in FIG. 4A is a structure in which the cathode side of the photoelectric conversion device 240 is electrically connected to the transistor 103 and the node FD is reset to a high potential in the operation; accordingly, the wiring 122 is set to a high potential (a potential higher than that of the wiring 121).

Figure 4B:
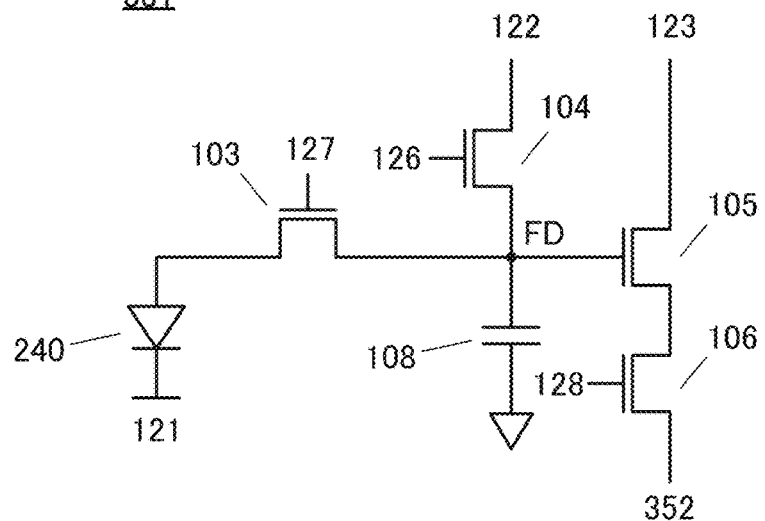

Although the cathode of the photoelectric conversion device 240 is electrically connected to the node FD in FIG. 4A, the anode side of the photoelectric conversion device 240 may be electrically connected to the one of the source and the drain of the transistor 103 as illustrated in FIG. 4B.

Since the node FD is reset to a low potential in the operation in the structure, the wiring 122 is set to a low potential (a potential lower than that of the wiring 121).

The transistor 103 has a function of controlling the potential of the node FD. The transistor 104 has a function of resetting the potential of the node FD. The transistor 105 functions as a component of a source follower circuit and can output the potential of the node FD as image data to the wiring 352. The transistor 106 has a function of selecting a pixel to which the image data is output.

OS transistors are preferably used as the transistors 103 to 106 included in the pixel circuit 331. The OS transistor has a feature of an extremely low off-state current. In particular, when transistors with a low off-state current are used as the transistors 103 and 104, charge can be retained at the node FD for an extremely long period. Therefore, a global shutter mode in which a charge accumulation operation is performed in all the pixels at the same time can be used without complicating the circuit structure and operation method.

Figure 4C:
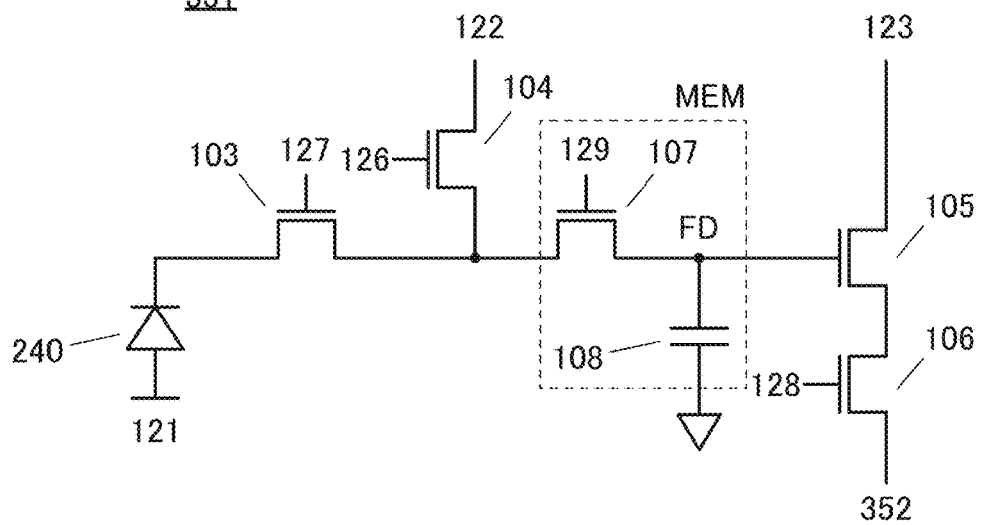

Alternatively, the pixel circuit 331 may have a structure illustrated in FIG. 4C. The pixel circuit 331 illustrated in FIG. 4C has a structure in which a transistor 107 is added to the structure in FIG. 4A.

One of a source and a drain of the transistor 107 is electrically connected to the other of the source and the drain of the transistor 103 and the one of the source and the drain of the transistor 104. The other of the source and the drain of the transistor 107 is electrically connected to the gate of the transistor 105 and the one electrode of the capacitor 108. A gate of the transistor 107 is electrically connected to a wiring 129. The wiring 129 can function as a signal line that controls the conduction of the transistor.

In the structure, a wiring that connects the other electrode of the transistor 107, the gate of the transistor 105, and the one electrode of the capacitor 108 is referred to as the node FD.

The transistor 107 has a function of suppressing leakage of the charge in the node FD. Thus, an OS transistor with a low off-state current is preferably used as the transistor 107. Note that it can also be said that the transistor 107 and the capacitor 108 form a memory circuit MEM.

With this structure, the leakage of the charge from the node FD can be suppressed even when Si transistors, which have a relatively high off-state current, are used as the transistor 103 and the transistor 104.

Accordingly, with the use of an OS transistor as the transistor 107, the node FD exhibits excellent retention characteristics even when all the other transistors are Si transistors. For example, when the leakage current of the OS transistor is 1 zA, the leakage current of the Si transistor is 30 fA, the capacitance of the capacitor 108 is 20 fF, and the frame rate is 60 Hz, the potential of the node FD decreases by 25 mV without the transistor 107, whereas it is estimated that the potential of the node FD decreases by 0.83 nV with the transistor 107.

Thus, the pixel circuit 331 with the above structure, in which an OS transistor is provided as the transistor 107, can have an improved data retention function in a pixel and is suitable for the global shutter operation. In addition, since Si transistors can be used as the transistors other than the transistor 107, high-speed operation can be performed.

Figure 5A:
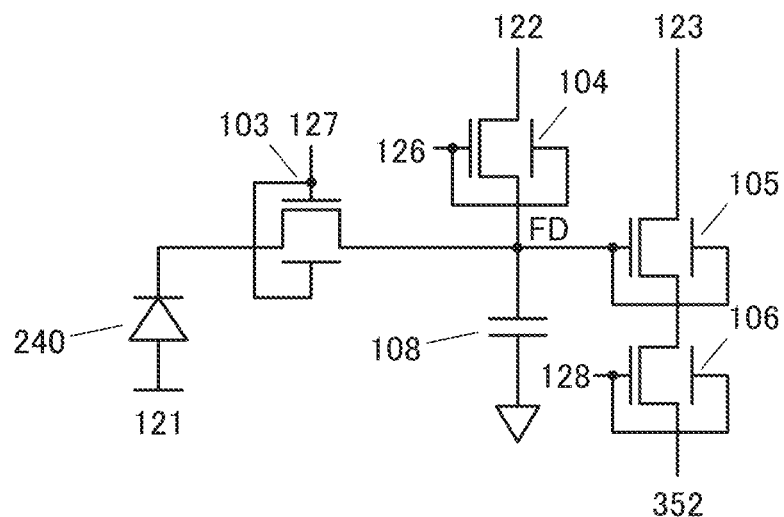
FIG. 5A and FIG. 5B are circuit diagrams illustrating pixel circuits.
Figure 5B:
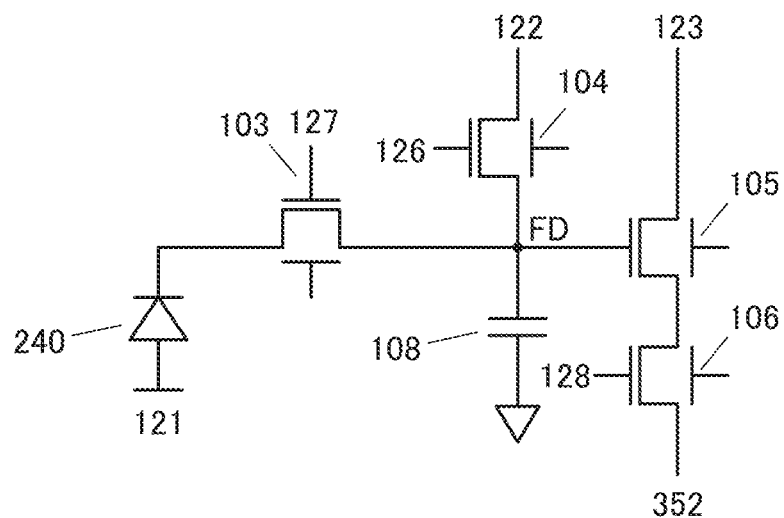

Alternatively, as illustrated in examples of FIG. 5A and FIG. 5B, a structure in which transistors are provided with back gates may be employed. FIG. 5A illustrates a structure in which the back gates are electrically connected to front gates, which has an effect of increasing on-state current. FIG. 5B illustrates a structure in which the back gates are electrically connected to wirings capable of supplying a constant potential, which enables the threshold voltage of the transistors to be controlled.

Alternatively, a structure in which transistors can operate properly may be employed by combining the structures of the transistors illustrated in FIG. 5A and FIG. 5B, for example. Furthermore, the pixel circuit 331 may include a transistor without a back gate. Although FIG. 5A and FIG. 5B each illustrate an example in which the back gates are provided in the pixel circuit 331 illustrated in FIG. 4A, the same can apply to the pixel circuit 331 in FIG. 4B or FIG. 4C.

Figure 6A:
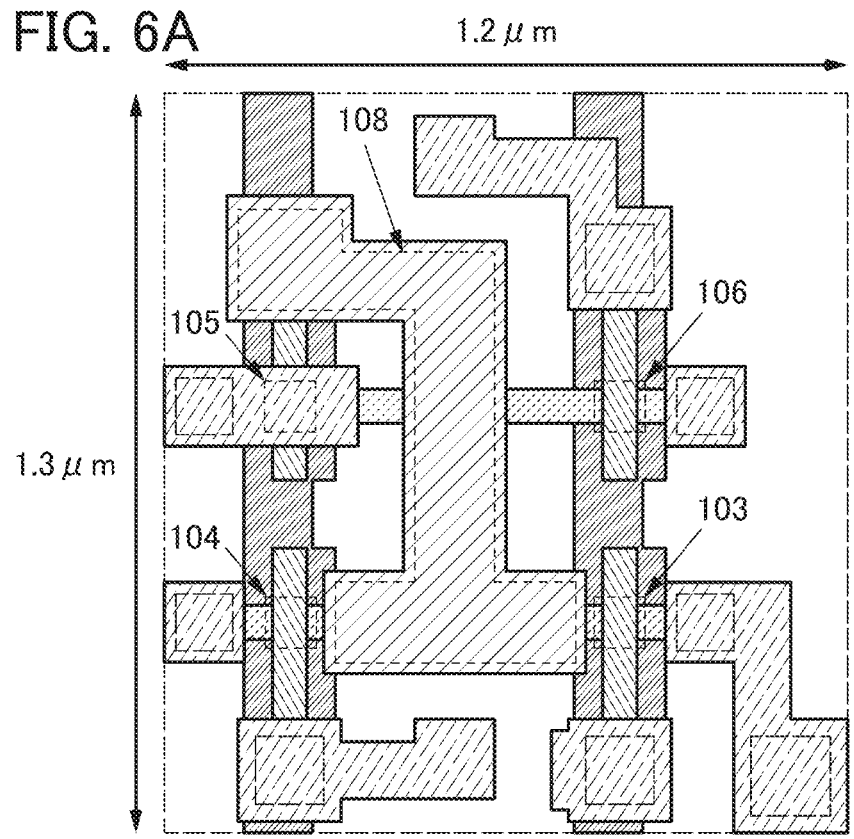
FIG. 6A and FIG. 6B are diagrams illustrating layouts of a pixel circuit.
Figure 6B:
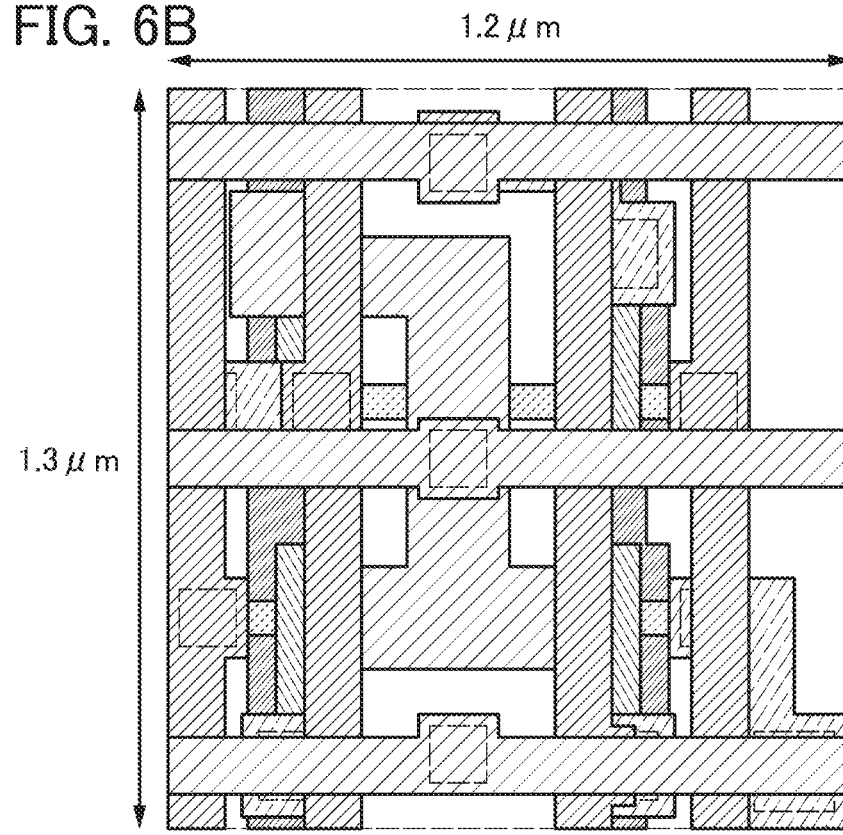

FIG. 6A and FIG. 6B are top views illustrating an example of the layout of the pixel circuit 331 illustrated in FIG. 5B. FIG. 6A illustrates layers up to an upper electrode of the capacitor 108 for clarity of the components of the pixel circuit 331. In FIG. 6B, wirings that connect the components or the components and the driver circuit are added. FIG. 6A and FIG. 6B illustrate an example in which the transistor size is W/L=60 nm/60 nm, and the components can fit in an area of 1.2 μm×1.3 μm.

<Reading Circuit>

Figure 7:
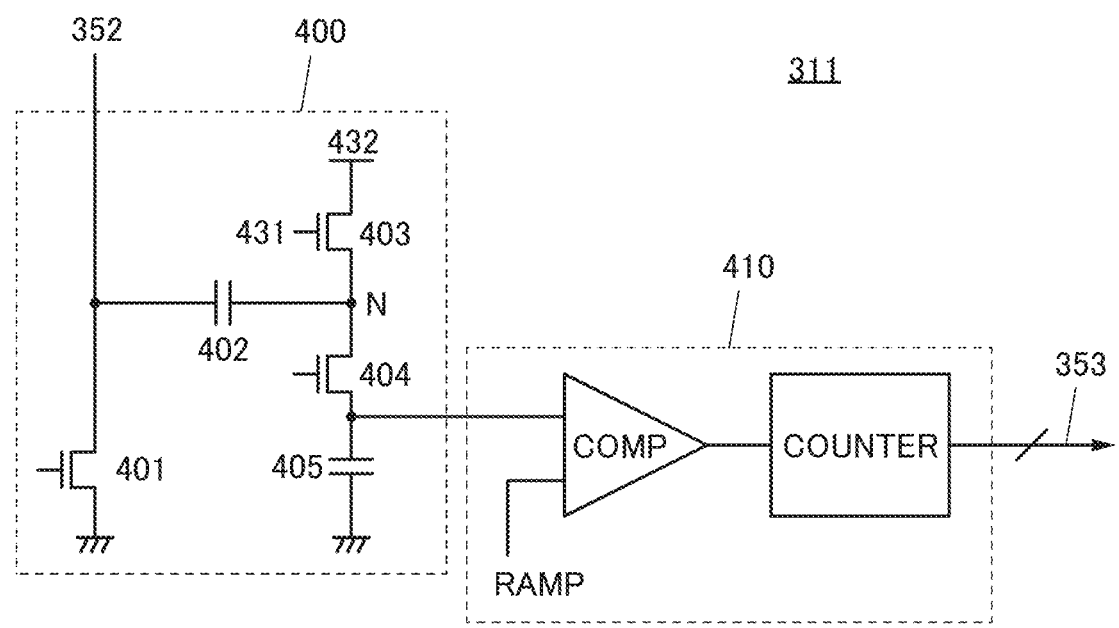
FIG. 7 is a circuit diagram and a block diagram illustrating a reading circuit.

FIG. 7 illustrates an example of the reading circuit 311 connected to the pixel circuit 331, and shows a circuit diagram of a CDS circuit 400 and a block diagram of an A/D converter 410 that is electrically connected to the CDS circuit 400. Note that the CDS circuit and the A/D converter illustrated in FIG. 7 are examples, and may each have another structure.

The CDS circuit 400 can include a transistor 401 for voltage conversion, a capacitor 402 for capacitive coupling, a transistor 403 for supplying a potential $V_0$, a transistor 404 for holding a potential supplied to the A/D converter 410, and a capacitor 405 for holding a potential. An input of the CDS circuit 400 is electrically connected to the pixel circuit 331, and an output of the CDS circuit 400 is electrically connected to a comparator circuit (COMP) of the A/D converter 410.

When the potential of the wiring 352 is $V_{res}+V_{data}$ (reset potential+image data potential), the potential of a node N (a connection point of the transistors 403 and 404 and the capacitor 402) is set to $V_0$. Then, the node N is brought into a floating state and the potential of the wiring 352 is set to $V_{res}$ (reset potential), whereby the amount of change in the potential of the wiring 352 is added to the node N by capacitive coupling of the capacitor 402. Thus, the potential of the node N is $V_0+((V_{res}+V_{data})-V_{res})$; given that $V_0=0$, only the term $V_{data}$ remains. $V_{res}$ includes the noise component in accordance with the transistor operation, so that the noise component can be reduced.

The A/D converter 410 can include the comparator circuit (COMP) and a counter circuit (COUNTER). In the A/D converter 410, a signal potential input from the CDS circuit 400 to the comparator circuit (COMP) and a swept reference potential (RAMP) are compared. Then, the counter circuit (COUNTER) operates in accordance with the output of the comparator circuit (COMP), and a digital signal is output to a plurality of wirings 353.

<Memory Circuit>

FIG. 8A illustrates the connection relation between the memory cell 321a included in the memory circuit 321, the row driver 312, and the column driver 313. An OS transistor can be used as a transistor included in the memory cell 321a.

The memory circuit 321 includes m×n memory cells 321a in total; m memory cells (m is an integer greater than or equal to 1) in a column and n memory cells (n is an integer greater than or equal to 1) in a row, and the memory cells 321a are arranged in a matrix. FIG. 8A also illustrates addresses of the memory cells 321a. For example, [1,1] represents a memory cell 321a positioned at an address of the first row and the first column, and [i,j] (i is an integer of 1 to m, and j is an integer of 1 to n) represents a memory cell 321a positioned at an address of the i-th row and the j-th column. The number of wirings connecting the memory circuit 321 and the row driver 312 is determined by the structure of the memory cell 321a, the number of memory cells 321a included in one column, or the like. The number of wirings connecting the memory circuit 321 and the column driver 313 is determined by the structure of the memory cell 321a, the number of memory cells 321a included in one row, or the like.

FIG. 8B to FIG. 8E illustrate a memory cell 321aA to a memory cell 321aD that can be used as the memory cell 321a. Note that in the following description, a bit line and the like can be connected to the column driver 313. A word line and the like can be connected to the row driver 312. Although the bit line and the like are also electrically connected to the reading circuit 311, the electrical connection therebetween is not illustrated here.

For the row driver 312 and the column driver 313, a decoder or a shift register can be used, for example. Note that a plurality of row drivers 312 and a plurality of column drivers 313 may be provided.

[DOSRAM]

FIG. 8B illustrates a circuit structure example of the memory cell 321aA of a DRAM type. In this specification and the like, a DRAM using an OS transistor is referred to as a DOSRAM (Dynamic Oxide Semiconductor Random Access Memory). The memory cell 321aA includes a transistor M11 and a capacitor Cs.

A first terminal of the transistor M11 is connected to a first terminal of the capacitor Cs, a second terminal of the transistor M11 is connected to a wiring BIL, a gate of the transistor M11 is connected to a wiring WL, and a back gate of the transistor M11 is connected to a wiring BGL. A second terminal of the capacitor Cs is connected to a wiring GNDL. The wiring GNDL is a wiring for supplying a low-level potential (reference potential).

The wiring BIL functions as a bit line. The wiring WL functions as a word line. The wiring BGL functions as a wiring for applying a potential to the back gate of the transistor M11. By applying a given potential to the wiring BGL, the threshold voltage of the transistor M11 can be increased or decreased.

Data writing and reading are performed in such a manner that a high-level potential is applied to the wiring WL to turn on the transistor M11 so that the wiring BIL is electrically connected to the first terminal of the capacitor Cs.

An OS transistor is preferably used as the transistor M11. An oxide semiconductor including one of indium, an element M (the element M is one or more of aluminum, gallium, yttrium, and tin), and zinc is preferably used for a semiconductor layer of the OS transistor. In particular, an oxide semiconductor including indium, gallium, and zinc is preferably used.

The OS transistor using the oxide semiconductor including indium, gallium, and zinc has a feature of an extremely low off-state current. The use of the OS transistor as the transistor M11 enables the leakage current of the transistor M11 to be extremely low. That is, with the use of the transistor M11, written data can be retained for a long time, and thus the frequency of refresh of the memory cell can be reduced. In addition, refresh operation of the memory cell can be omitted.

[NOSRAM]

FIG. 8C illustrates a circuit structure example of the memory cell 321aB that is of a gain cell type including two transistors and one capacitor (also referred to as "2Tr1C-type"). The memory cell 321aB includes the transistor M11, a transistor M3, and the capacitor Cs.

The first terminal of the transistor M11 is connected to the first terminal of the capacitor Cs, the second terminal of the transistor M11 is connected to a wiring WBL, the gate of the transistor M11 is connected to the wiring WL, and the back gate of the transistor M11 is connected to the wiring BGL. The second terminal of the capacitor Cs is connected to a wiring RL. A first terminal of the transistor M3 is connected to a wiring RBL, a second terminal of the transistor M3 is connected to a wiring SL, and a gate of the transistor M3 is connected to the first terminal of the capacitor Cs.

The wiring WBL functions as a write bit line. The wiring RBL functions as a read bit line. The wiring WL functions as a word line. The wiring RL functions as a wiring for applying a predetermined potential to the second terminal of the capacitor Cs. The reference potential is preferably applied to the wiring RL at the time of data writing and during data retention.

The wiring BGL functions as a wiring for applying a potential to the back gate of the transistor M11. By applying a given potential to the wiring BGL, the threshold voltage of the transistor M11 can be increased or decreased.

Data writing is performed in such a manner that a high-level potential is applied to the wiring WL to turn on the transistor M11 so that the wiring WBL is electrically connected to the first terminal of the capacitor Cs. Specifically, when the transistor M11 is in an on state, a potential corresponding to information to be stored is applied to the wiring WBL, whereby the potential is written to the first terminal of the capacitor Cs and the gate of the transistor M3. After that, a low-level potential is applied to the wiring WL to turn off the transistor M11, whereby the potential of the first terminal of the capacitor Cs and the potential of the gate of the transistor M3 are retained.

Data reading is performed by applying a predetermined potential to the wiring RL and the wiring SL. A current flowing between a source and a drain of the transistor M3 and the potential of the first terminal of the transistor M3 are determined by the potential of the gate of the transistor M3 and the potential of the second terminal of the transistor M3; thus, by reading out the potential of the wiring RBL connected to the first terminal of the transistor M3, the potential retained at the first terminal of the capacitor Cs (or the gate of the transistor M3) can be read. In other words, information written to this memory cell can be read from the potential retained at the first terminal of the capacitor Cs (or the gate of the transistor M3). Alternatively, existence or absence of information written to this memory cell can be found.

Alternatively, as illustrated in FIG. 8D, the wiring WBL and the wiring RBL may be combined into one wiring BIL. In the memory cell 321aC illustrated in FIG. 8D, one wiring BIL corresponds to the wiring WBL and the wiring RBL in the memory cell 321aB, and the second terminal of the transistor M11 and the first terminal of the transistor M3 are connected to the wiring BIL. In other words, in the memory cell 321aC, one wiring BIL operates as a write bit line and a read bit line.

Note that also in each of the memory cell 321aB and the memory cell 321aC, an OS transistor is preferably used as the transistor M11. A memory device using a 2Tr1C-type memory cell using an OS transistor as the transistor M11, such as the memory cell 321aB and the memory cell 321aC, is referred to as a NOSRAM (Non-volatile Oxide Semiconductor Random Access Memory).

FIG. 8D illustrates a circuit structure example of the memory cell 321aD that is of a gain cell including three transistors and one capacitor (also referred to as "3Tr1C-type"). The memory cell 321aD includes the transistor M11, a transistor M5, a transistor M6, and the capacitor Cs.

The first terminal of the transistor M11 is connected to the first terminal of the capacitor Cs, the second terminal of the transistor M11 is connected to the wiring BIL, the gate of the transistor M11 is connected to the wiring WL, and the back gate of the transistor M11 is electrically connected to the wiring BGL. The second terminal of the capacitor Cs is electrically connected to a first terminal of the transistor M5 and the wiring GNDL. A second terminal of the transistor M5 is connected to a first terminal of the transistor M6, and a gate of the transistor M5 is connected to the first terminal of the capacitor Cs. A second terminal of the transistor M6 is connected to the wiring BIL, and a gate of the transistor M6 is connected to the wiring RL.

The wiring BIL functions as a bit line, the wiring WL functions as a write word line, and the wiring RL functions as a read word line.

The wiring BGL functions as a wiring for applying a potential to the back gate of the transistor M11. By applying a given potential to the wiring BGL, the threshold voltage of the transistor M11 can be increased or decreased.

Data writing is performed in such a manner that a high-level potential is applied to the wiring WL to turn on the transistor M11 so that the wiring BIL is connected to the first terminal of the capacitor Cs. Specifically, when the transistor M11 is in an on state, a potential corresponding to information to be stored is applied to the wiring BIL, whereby the potential is written to the first terminal of the capacitor Cs and the gate of the transistor M5. After that, a low-level potential is applied to the wiring WL to turn off the transistor M11, whereby the potential of the first terminal of the capacitor Cs and the potential of the gate of the transistor M5 are retained.

Data reading is performed in such a manner that after a predetermined potential is precharged to the wiring BIL, the wiring BIL is brought into an electrically floating state, and a high-level potential is applied to the wiring RL. Since the wiring RL has the high-level potential, the transistor M6 is turned on, which electrically connects the wiring BIL and the second terminal of the transistor M5. At this time, the potential of the wiring BIL is applied to the second terminal of the transistor M5; the potential of the second terminal of the transistor M5 and the potential of the wiring BIL are changed in accordance with the potential retained at the first terminal of the capacitor Cs (or the gate of the transistor M5). Here, by reading out the potential of the wiring BIL, the potential retained at the first terminal of the capacitor Cs (or the gate of the transistor M5) can be read. In other words, information written to this memory cell can be read from the potential retained at the first terminal of the capacitor Cs (or the gate of the transistor M5). Alternatively, existence or absence of information written to this memory cell can be found.

Note that also in the memory cell 321aD, an OS transistor is preferably used as the transistor M11. The 3Tr1C-type memory cell 321aD using an OS transistor as the transistor M11 is one embodiment of the NOSRAM. The circuit structure of the memory cell can be changed as appropriate.

<Operation Method of Imaging Device>

FIG. 9A is a schematic view of an operation method with a rolling shutter mode, and FIG. 9B is a schematic view of the global shutter mode. Note that En denotes exposure (accumulation operation) in the n-th column (n is a natural number), and Rn denotes reading operation in the n-th column. In FIG. 9A and FIG. 9B, operations from the first row (Line [1]) to the M-th row (Line [M], M is a natural number) are shown.

The rolling shutter mode is an operation method in which exposure and data reading are performed sequentially and a reading period of a row overlaps with an exposure period of another row. The reading operation is performed right after the exposure, so that images can be taken even with a circuit structure having a relatively short data retention period. However, an image of one frame is composed of data that does not have simultaneity of imaging; therefore, distortion is caused in an image when imaging of a moving object is performed.

On the other hand, the global shutter mode is an operation method in which exposure is performed on all the pixels at the same time, data is retained in each pixel, and data reading is performed row by row. Thus, an undistorted image can be obtained even when imaging of a moving object is performed.

In the case where a transistor with a relatively high off-state current, such as a Si transistor, is used in a pixel circuit, charge easily leaks from a charge detection portion and thus the rolling shutter mode is used in many cases. In order to achieve the global shutter mode using a Si transistor, it is necessary to perform complicated operation at high speed, for example, to store data in a separate memory circuit. In contrast, when an OS transistor is used in a pixel circuit, the data potential hardly leaks from the charge detection portion; thus, the global shutter mode can be easily achieved. Note that the imaging device of one embodiment of the present invention can also operate in the rolling shutter mode.

Note that the pixel circuit 331 may have a structure in which an OS transistor and a Si transistor are combined freely. Alternatively, all the transistors may be Si transistors.

<Operation of Pixel Circuit>

Figure 10A:
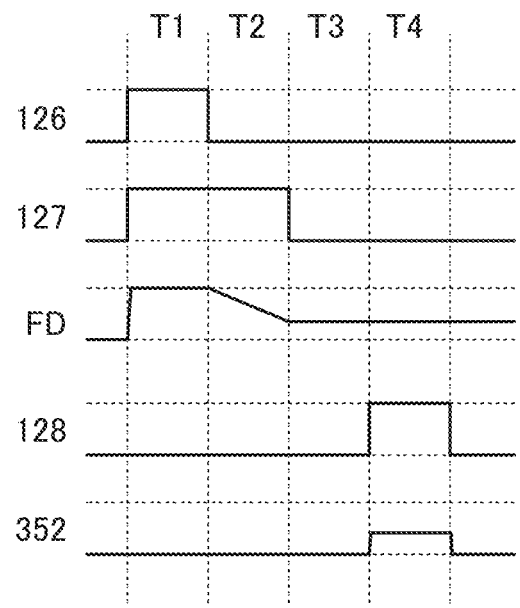
FIG. 10A to FIG. 10C are timing charts showing an operation of pixel circuits.

Next, an example of the operation of the pixel circuit 331 illustrated in FIG. 4A is described with reference to a timing chart of FIG. 10A. Note that in the description of the timing chart in this specification, a high potential is denoted by "H" and a low potential is denoted by "L". The wiring 121 is always supplied with "L", and the wirings 122 and 123 are always supplied with "H".

In a period T1, the potential of the wiring 126 is set to "H", the potential of the wiring 127 is set to "H", and the potential of the wiring 128 is set to "L", whereby the transistors 103 and 104 are turned on and the potential "H" of the wiring 122 is supplied to the node FD (reset operation).

In a period T2, the potential of the wiring 126 is set to "L", the potential of the wiring 127 is set to "H", and the potential of the wiring 128 is set to "L", whereby the transistor 104 is turned off and supply of the reset potential is stopped. Furthermore, the potential of the node FD is decreased in accordance with the operation of the photoelectric conversion device 240 (accumulation operation).

In a period T3, the potential of the wiring 126 is set to "L", the potential of the wiring 127 is set to "L", and the potential of the wiring 128 is set to "L", whereby the transistor 103 is turned off and the potential of the node FD is fixed and retained (retention operation). At this time, OS transistors with a low off-state current are used as the transistor 103 and the transistor 104, which are connected to the node FD, whereby unnecessary charge leakage from the node FD can be suppressed and the data retention time can be extended.

In a period T4, the potential of the wiring 126 is set to "L", the potential of the wiring 127 is set to "L", and the potential of the wiring 128 is set to "H", whereby the transistor 106 is turned on and the potential of the node FD is read out to the wiring 352 by source follower operation of the transistor 105 (reading operation).

The above is an example of the operation of the pixel circuit 331 illustrated in FIG. 4A.

Figure 10B:
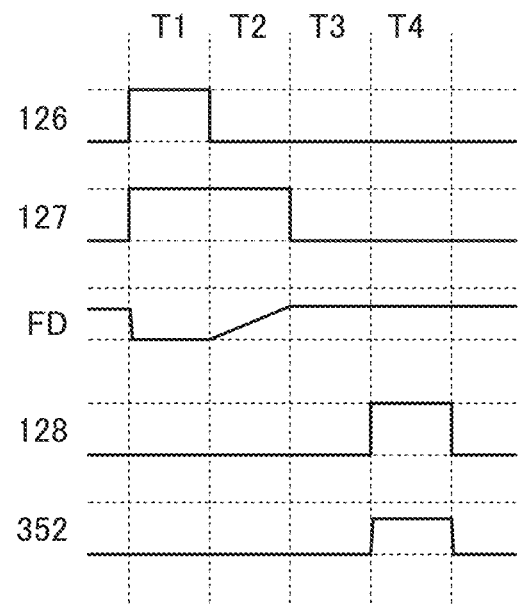

The pixel circuit 331 illustrated in FIG. 4B can operate in accordance with a timing chart of FIG. 10B. The wirings 121 and 123 are always supplied with "H", and the wiring 122 is always supplied with "L". The basic operation is similar to that described above with the timing chart of FIG. 10A.

Figure 10C:
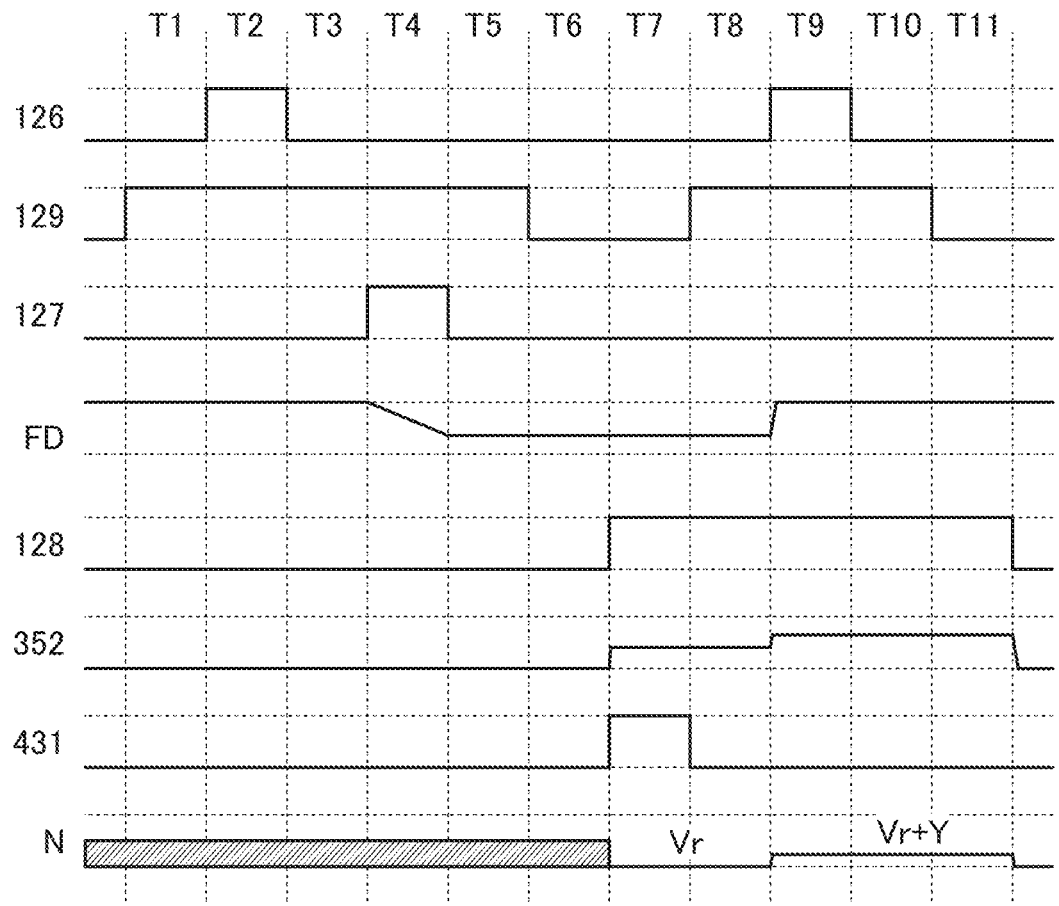

The pixel circuit 331 illustrated in FIG. 4C can operate in accordance with a timing chart of FIG. 10C. Note that in the pixel circuit 331 in FIG. 4C, reading operation in the CDS circuit 400 can be performed easily by controlling the wiring 129 row by row. Therefore, the operation of the CDS circuit 400 is also described here. Note that an appropriate analog potential is supplied to a gate of the transistor 401 (see FIG. 7).

In the period T1, the potential of the wiring 126 is set to "L", the potential of the wiring 127 is set to "L", the potential of the wiring 128 is set to "L", and the potential of the wiring 129 is set to "H", whereby the transistor 107 is turned on.

Then, in the period T2, the potential of the wiring 126 is set to "H", the potential of the wiring 127 is set to "L", the potential of the wiring 128 is set to "L", and the potential of the wiring 129 is set to "H", whereby the transistor 104 is turned on and the potential "H" (reset potential) of the wiring 122 is supplied to the node FD (reset operation).

In the period T3, the potential of the wiring 126 is set to "L", the potential of the wiring 127 is set to "L", the potential of the wiring 128 is set to "L", and the potential of the wiring 129 is set to "H", whereby the transistor 104 is turned off and the potential of the node FD is retained at the reset potential.

In the period T4, the potential of the wiring 126 is set to "L", the potential of the wiring 127 is set to "H", the potential of the wiring 128 is set to "L", and the potential of the wiring 129 is set to "H", whereby the transistor 103 is turned on and the potential of the node FD is decreased in accordance with the operation of the photoelectric conversion device 240 (transfer operation).

In a period T5, the potential of the wiring 126 is set to "L", the potential of the wiring 127 is set to "L", the potential of the wiring 128 is set to "L", and the potential of the wiring 129 is set to "H", whereby the transistor 103 is turned off and the potential of the node FD is fixed.

In a period T6, the potential of the wiring 126 is set to "L", the potential of the wiring 127 is set to "L", the potential of the wiring 128 is set to "L", and the potential of the wiring 129 is set to "L", whereby the transistor 107 is turned off and the potential of the node FD is retained (retention operation). At this time, an OS transistor with a low off-state current is used as the transistor 107, which is connected to the node FD, whereby unnecessary charge leakage from the node FD can be suppressed and the data retention time can be extended.

In a period T7, the potential of the wiring 126 is set to "L", the potential of the wiring 127 is set to "L", the potential of the wiring 128 is set to "H", the potential of the wiring 129 is set to "L", and the potential of the wiring 431 (see FIG. 7) is set to "H", whereby the transistor 106 is turned on and the potential of the node FD is read out to the wiring 352 by source follower operation of the transistor 105 (reading operation).

In the CDS circuit 400 (see FIG. 7), the transistor 403 is turned on and the potential of the node N is reset to the potential "Vr" of the wiring 432. That is, when one electrode of the capacitor 402, which is electrically connected to the wiring 352, has a potential that allows the pixel circuit 331 to output image data, the potential of the node N (the other electrode of the capacitor 402) is initialized to the potential "Vr".

At a time T8, the potential of the wiring 126 is set to "L", the potential of the wiring 127 is set to "L", the potential of the wiring 128 is set to "H", the potential of the wiring 129 is set to "H", and the potential of the wiring 431 is set to "L", whereby the transistor 107 is turned on. In addition, the potential of the node N is kept at the potential "Vr".

At a time T9, the potential of the wiring 126 is set to "H", the potential of the wiring 127 is set to "L", the potential of the wiring 128 is set to "H", the potential of the wiring 129 is set to "H", and the potential of the wiring 431 is set to "L", whereby the transistor 104 is turned on and the potential "H" (reset potential) of the wiring 122 is supplied to the node FD.

The potential of the wiring 126 is set to "L" at a time T10 and the potential of the wiring 129 is set to "L" at a time T11, whereby the transistor 104 and the transistor 107 are turned off and the potential of the node FD is kept at the reset potential.

Then, the potential of the one electrode of the capacitor 402 is changed due to source follower operation in accordance with a potential change in the node FD, whereby the amount Y of the change is added to the potential "Vr" of the node N by capacitive coupling. Therefore, the potential of the node N becomes "Vr+Y". Here, Y is image data including no reset potential component, and data from which the noise component is reduced is read out.

<Stacked-Layer Structure 1>

Next, a stacked-layer structure of the imaging device is described with reference to a cross-sectional view.

Figure 11:
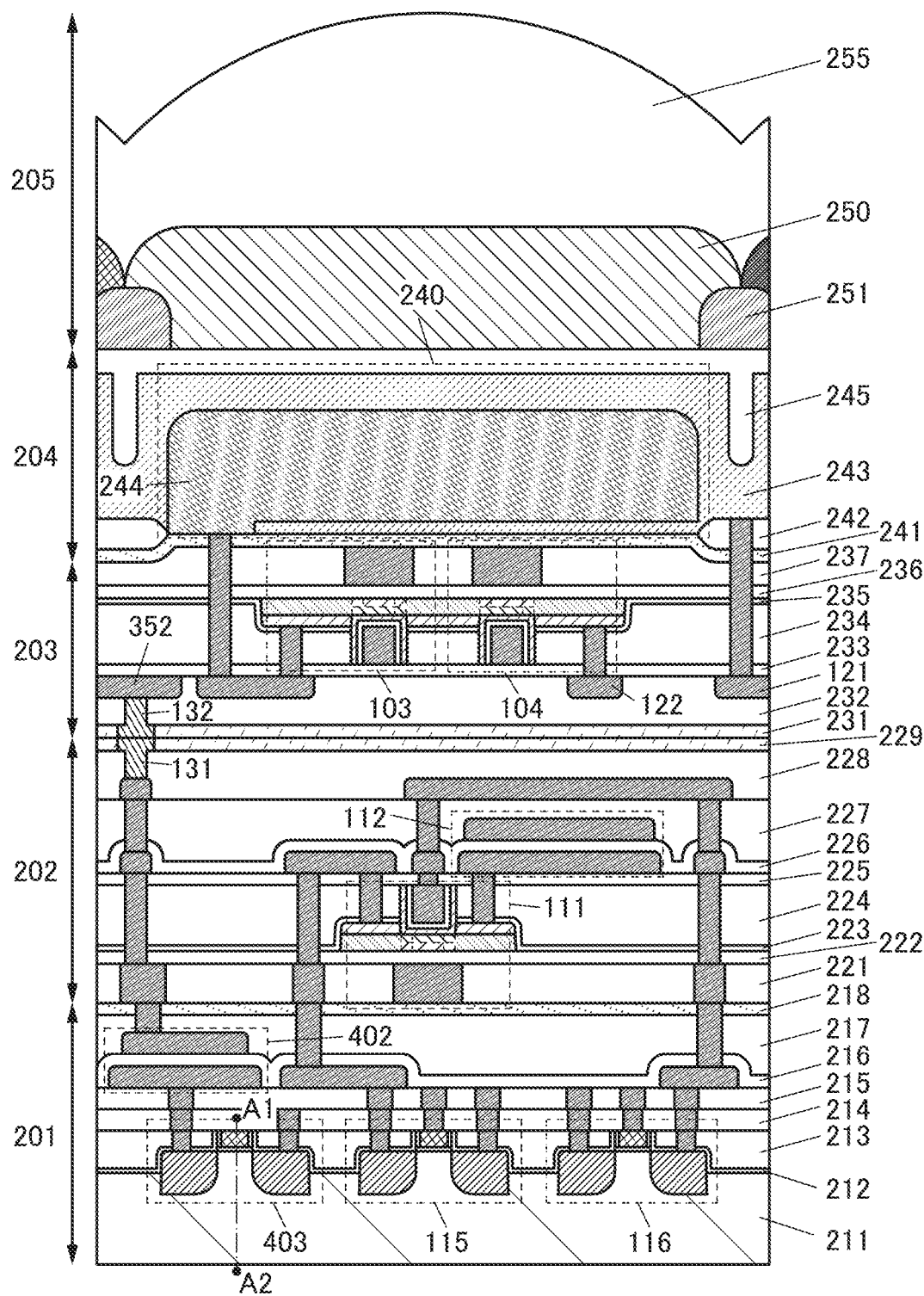
FIG. 11 is a cross-sectional view illustrating a pixel.

FIG. 11 is an example of a cross-sectional view of a stacked body that includes the layer 201 to the layer 205 and has a bonding plane between the layer 202 and the layer 203.

<Layer 201>

The layer 201 includes the reading circuit 311, the row driver 312, and the column driver 313 provided on a silicon substrate 211. Here, as parts of the circuits, the capacitor 402 and the transistor 403 included in the CDS circuit of the reading circuit 311, a transistor 115 included in the A/D converter of the reading circuit 311, and a transistor 116 included in the row driver 312 are shown. The one electrode of the capacitor 402 is electrically connected to one of a source and a drain of the transistor 403.

Insulating layers 212, 213, 214, 215, 216, 217, and 218 are provided in the layer 201. The insulating layer 212 functions as a protective film. The insulating layers 212, 213, 214, and 217 function as interlayer insulating films and planarization films. The insulating layer 216 functions as a dielectric layer of the capacitor 402. The insulating layer 218 functions as a blocking film.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. As the blocking film, a film that has a function of preventing hydrogen diffusion is preferably used.

In a Si device, hydrogen is necessary to terminate dangling bonds; however, hydrogen in the vicinity of an OS transistor is one factor of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

Figure 12A:
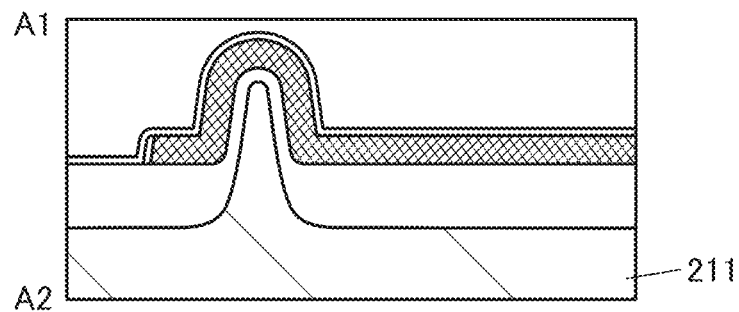
FIG. 12A to FIG. 12C are diagrams illustrating Si transistors.
Figure 12B:
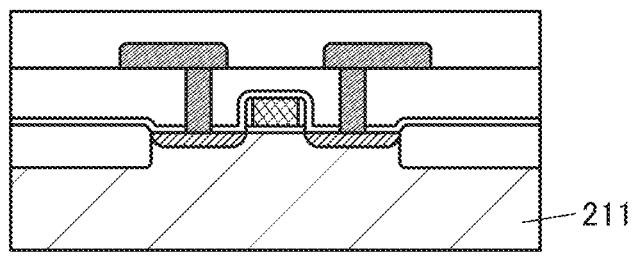

The Si transistors illustrated in FIG. 11 each have a fin-type structure including a channel formation region in the silicon substrate 211, and FIG. 12A shows a cross section (an A1-A2 cross section in FIG. 11) in the channel width direction. Note that the Si transistors may each have a planar-type structure as illustrated in FIG. 12B.

Figure 12C:
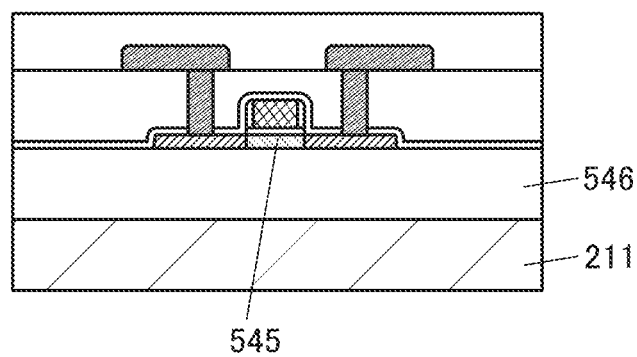

Alternatively, as illustrated in FIG. 12C, a transistor including a semiconductor layer 545 of a silicon thin film may be used. The semiconductor layer 545 can be single crystal silicon (SOI (Silicon on Insulator)) formed on an insulating layer 546 on the silicon substrate 211, for example.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

<Layer 202>

The layer 202 is formed over the layer 201. The layer 202 includes the memory circuit 321 including an OS transistor. Here, a transistor 111 and a capacitor 112 included in the memory cell 321a are shown as part of the memory circuit 321.

Insulating layers 221, 222, 223, 224, 225, 226, 227, 228, and 229 are provided in the layer 202. Moreover, a conductive layer 131 is provided.

The insulating layers 221, 224, 225, 227, and 228 function as interlayer insulating films and planarization films. The insulating layer 222 functions as a gate insulating film. The insulating layer 223 functions as a protective film and the insulating layer 226 functions as a dielectric layer of the capacitor. The insulating layer 229 and the conductive layer 131 function as bonding layers.

As the gate insulating film, a silicon oxide film or the like can be used. The bonding layers will be described later.

The conductive layer 131 is electrically connected to the other electrode of the capacitor 402 in the layer 201. One of a source and a drain of the transistor 111 is electrically connected to one of a source and a drain of the transistor 115 in the layer 201. A gate of the transistor 111 is electrically connected to one of a source and a drain of the transistor 116 in the layer 201. The other of the source and the drain of the transistor 111 is electrically connected to one electrode of the capacitor 112.

Figure 13A:
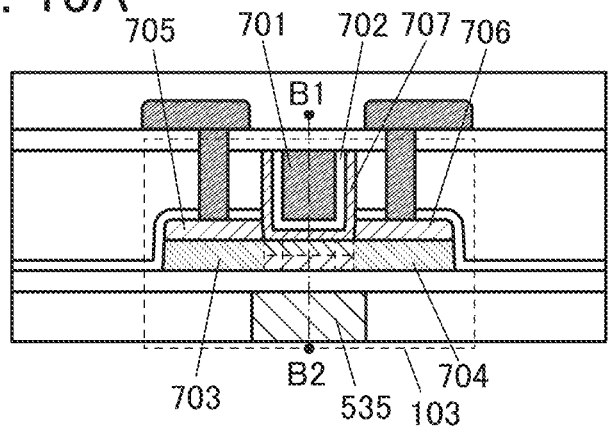
FIG. 13A to FIG. 13D are diagrams illustrating OS transistors.

The details of an OS transistor are illustrated in FIG. 13A. The OS transistor illustrated in FIG. 13A has a self-aligned structure in which a source electrode 705 and a drain electrode 706 are formed through provision of an insulating layer over a stacked layer of an oxide semiconductor layer and a conductive layer and provision of opening portions reaching the oxide semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the opening portion. The groove may further be provided with an oxide semiconductor layer 707.

Figure 13B:
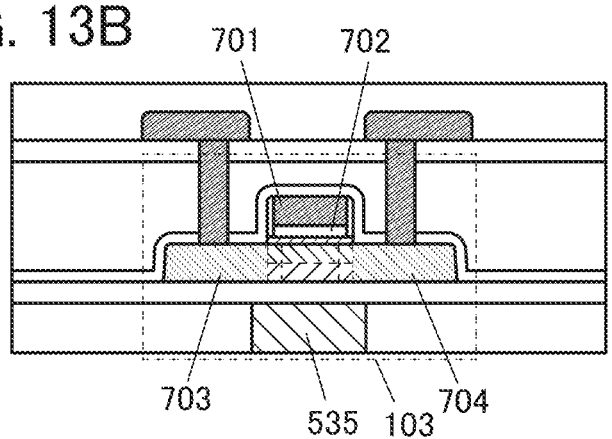

As illustrated in FIG. 13B, the OS transistor may have a self-aligned structure in which the source region 703 and the drain region 704 are formed in the semiconductor layer with the gate electrode 701 as a mask.

Figure 13C:
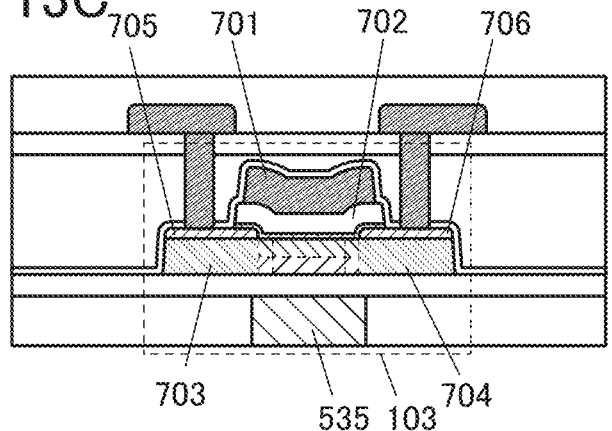

As illustrated in FIG. 13C, the OS transistor may be a non-self-aligned top-gate transistor including a region where the source electrode 705 or the drain electrode 706 overlaps with the gate electrode 701.

Figure 13D:
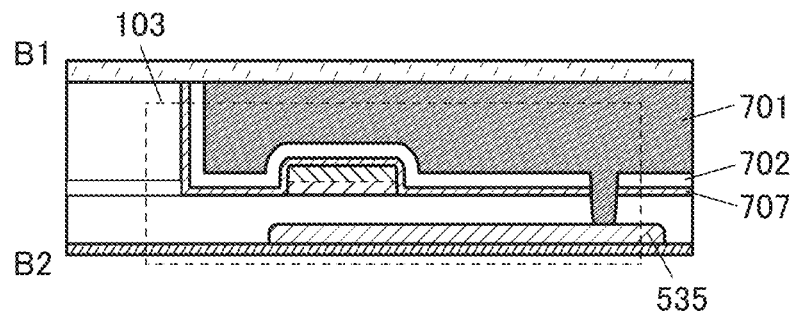

Although the OS transistor has a structure with a back gate 535, it may have a structure without a back gate. As illustrated in a cross-sectional view of the transistor in the channel width direction in FIG. 13D, the back gate 535 may be electrically connected to a front gate of the transistor, which is provided to face the back gate. Note that FIG. 13D illustrates an example of a B1-B2 cross section of the transistor in FIG. 13A, and the same applies to a transistor having any of the other structures. Different fixed potentials may be supplied to the back gate 535 and the front gate.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (one or more of metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements of a sputtering target used for forming the In-M-Zn-based oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/\text{cm}^3$, preferably lower than or equal to $1\times10^{15}/\text{cm}^3$, further preferably lower than or equal to $1\times10^{13}/\text{cm}^3$, still further preferably lower than or equal to $1\times10^{11}/\text{cm}^3$, even further preferably lower than $1\times10^{10}/\text{cm}^3$, and higher than or equal to $1\times10^{-9}/\text{cm}^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor having a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1\leq x0\leq1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using the CAC-OS has high reliability. Thus, the CAC-OS is suitably used as a constituent material of a variety of semiconductor devices.

<Layer 203>

The layer 203 is formed over the layer 202. The layer 203 includes the pixel circuit 331 including an OS transistor. Here, the transistor 103 and the transistor 104 are shown as part of the pixel circuit 331.

Insulating layers 231, 232, 233, 234, 235, 236, and 237 are provided in the layer 203. Moreover, a conductive layer 132 is provided.

The insulating layer 231 and the conductive layer 132 function as bonding layers. The insulating layers 232, 233, 234, and 237 function as interlayer insulating films and planarization films. The insulating layer 235 functions as a protective layer. The insulating layer 236 functions as a gate insulating film.

The conductive layer 132 is electrically connected to the wiring 352 functioning as the output line of the pixel circuit 331.

<Layer 204>

The layer 204 includes the photoelectric conversion device 240 and insulating layers 241, 242, and 245.

The photoelectric conversion device 240 is a pn-junction photodiode formed on a silicon substrate and includes a p-type region 243 and an n-type region 244. The photoelectric conversion device 240 is a pinned photodiode, which can suppress dark current and reduce noise with the thin p-type region 243 provided on the surface side (current extraction side) of the n-type region 244.

The insulating layer 241 functions as a blocking layer. The insulating layer 242 functions as an element isolation layer. The insulating layer 245 has a function of suppressing carrier leakage.

The silicon substrate is provided with a groove that separates pixels, and the insulating layer 245 is provided on the top surface of the silicon substrate and in the groove. The insulating layer 245 can suppress leakage of carriers generated in the photoelectric conversion device 240 to an adjacent pixel. The insulating layer 245 also has a function of suppressing entry of stray light. Therefore, color mixture can be suppressed with the insulating layer 245. Note that an anti-reflection film may be provided between the top surface of the silicon substrate and the insulating layer 245.

The element isolation layer can be formed by a LOCOS (LOCal Oxidation of Silicon) method, an STI (Shallow Trench Isolation) method, or the like. As the insulating layer 245, for example, an inorganic insulating film of silicon oxide, silicon nitride, or the like or an organic insulating film of a polyimide resin, an acrylic resin, or the like can be used. The insulating layer 245 may have a multilayer structure.

The n-type region 244 (corresponding to a cathode) of the photoelectric conversion device 240 is electrically connected to the one of the source and the drain of the transistor 103 in the layer 203. The p-type region 243 (anode) is electrically connected to the wiring 121 functioning as the power supply line in the layer 203.

<Layer 205>

The layer 205 is formed over the layer 204. The layer 205 includes a light-blocking layer 251, the optical conversion layer 250, and the microlens array 255.

The light-blocking layer 251 can suppress entry of light into an adjacent pixel. As the light-blocking layer 251, a metal layer of aluminum, tungsten, or the like can be used. The metal layer and a dielectric film functioning as an anti-reflection film may be stacked.

As the optical conversion layer 250, a color filter can be used. When colors of R (red), G (green), B (blue), Y (yellow), C (cyan), M (magenta), and the like are assigned to the color filters of respective pixels, a color image can be obtained.

When a wavelength cut filter is used as the optical conversion layer 250, the imaging device can capture images in various wavelength regions For example, when a filter that blocks light having a wavelength shorter than or equal to that of visible light is used as the optical conversion layer 250, an infrared imaging device can be obtained. When a filter that blocks light having a wavelength shorter than or equal to that of near infrared light is used as the optical conversion layer 250, a far-infrared imaging device can be obtained. When a filter that blocks light having a wavelength longer than or equal to that of visible light is used as the optical conversion layer 250, an ultraviolet imaging device can be obtained.

Furthermore, when a scintillator is used as the optical conversion layer 250, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 240 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, $ZnO$, or the like is dispersed can be used.

The microlens array 255 is provided over the optical conversion layer 250. Light passing through an individual lens of the microlens array 255 goes through the optical conversion layer 250 directly under the lens, and the photoelectric conversion device 240 is irradiated with the light. With the microlens array 255, collected light can be incident on the photoelectric conversion device 240; thus, photoelectric conversion can be efficiently performed. The microlens array 255 is preferably formed using a resin, glass, or the like with a high visible-light transmitting property.

<Bonding>

Next, bonding of the layer 202 and the layer 203 is described.

The insulating layer 229 and the conductive layer 131 are provided in the layer 202. The conductive layer 131 includes a region embedded in the insulating layer 229. Furthermore, the surfaces of the insulating layer 229 and the conductive layer 131 are planarized to be level with each other.

The insulating layer 231 and the conductive layer 132 are provided in the layer 203. The conductive layer 132 includes a region embedded in the insulating layer 232. Furthermore, the surfaces of the insulating layer 231 and the conductive layer 132 are planarized to be level with each other.

Here, a main component of the conductive layer 131 and a main component of the conductive layer 132 are preferably the same metal element. Furthermore, the insulating layer 229 and the insulating layer 231 are preferably formed of the same component.

For the conductive layers 131 and 132, Cu, Al, Sn, Zn, W, Ag, Pt, or Au can be used, for example. Preferably, Cu, Al, W, or Au is used for easy bonding. In addition, for the insulating layers 229 and 231, silicon oxide, silicon oxynitride, silicon nitride oxide, silicon nitride, titanium nitride, or the like can be used.

That is, the same metal material described above is preferably used for the conductive layer 131 and the conductive layer 132. Furthermore, the same insulating material described above is preferably used for the insulating layer 229 and the insulating layer 231. With this structure, bonding can be performed at the boundary between the layer 202 and the layer 203.

Note that the conductive layer 131 and the conductive layer 132 may each have a multilayer structure of a plurality of layers; in that case, the outer layers (bonding surfaces) are formed of the same metal material. The insulating layer 229 and the insulating layer 231 may each have a multilayer structure of a plurality of layers; in that case, the outer layers (bonding surfaces) are formed of the same insulating material.

Through the above bonding, the electrical connection between the conductive layer 131 and the conductive layer 132 can be obtained. Moreover, the connection between the insulating layer 229 and the insulating layer 231 with mechanical strength can be obtained.

For bonding metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 202 and the layer 203 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows electrical connection between the pixel circuit 331 included in the layer 203 and the reading circuit 311 included in the layer 201.

Modification Example 1 of Stacked-Layer Structure 1

Figure 14A:
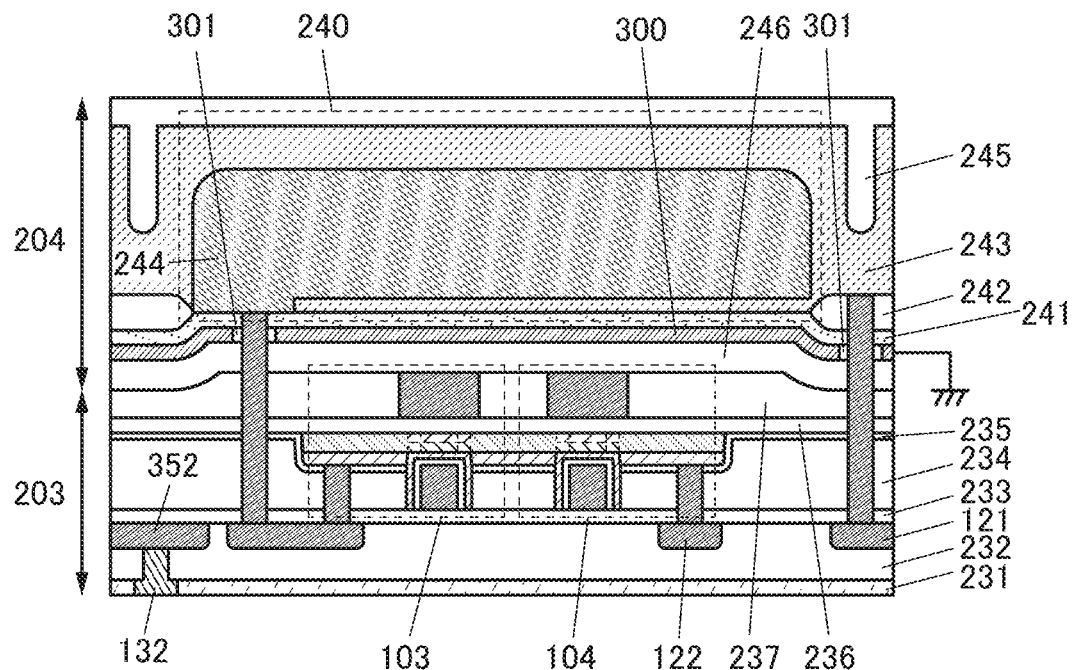
FIG. 14A and FIG. 14B are cross-sectional views illustrating pixels.

FIG. 14A illustrates a modification example in which the layer 204 has a structure different from that in the stacked-layer structure 1 illustrated in FIG. 11. In the modification example 1 illustrated in FIG. 14A, a light-blocking layer 300 and an insulating layer 246 functioning as an interlayer insulating film are provided between the insulating layer 241 included in the layer 204 and the layer 237 included in the layer 203. Note that the layers 201, 202, and 205 are omitted from the drawing.

The light-blocking layer 300 can be formed using a conductive film of a metal or the like. The light-blocking layer 300 can block light that fails to be absorbed by the photoelectric conversion device 240 from being emitted to the layer 203. The sensitivity of the photoelectric conversion device 240 can be increased by light reflected by the light-blocking layer 300. Note that an opening portion 301 is preferably provided in a region where a plug or the like connected to the photoelectric conversion device 240 is provided.

Light emission to the OS transistor included in the layer 203 is a factor of noise such as an increase in off-state current. Therefore, noise can be reduced. In addition, the potential of the light-blocking layer 300 is fixed to a GND potential or the like and thus the light-blocking layer 300 can function as an electromagnetic shield. Therefore, noise can be further reduced.

Modification Example 2 of Stacked-Layer Structure 1

Figure 14B:
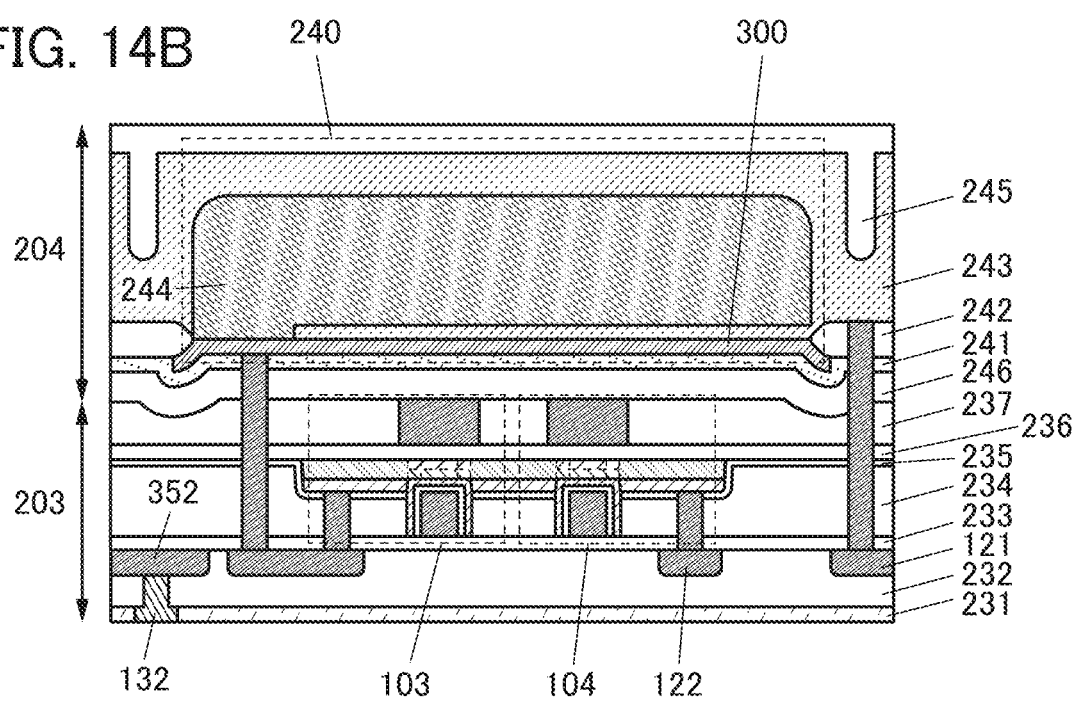

Alternatively, as illustrated in FIG. 14B, the light-blocking layer 300 may be used as a cathode electrode of the photoelectric conversion device 240.

Modification Example 3 of Stacked-Layer Structure 1

Figure 15A:
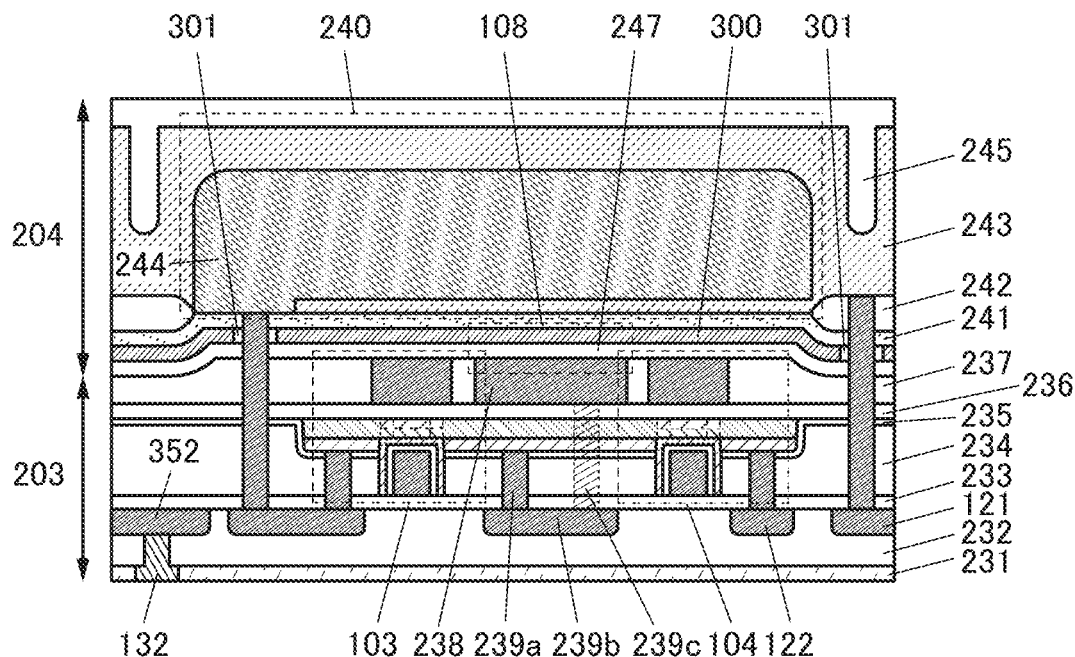
FIG. 15A and FIG. 15B are cross-sectional views illustrating pixels.

Alternatively, as illustrated in FIG. 15A, the light-blocking layer 300 may be used as the other electrode of the capacitor 108 included in the pixel circuit 331. In that case, an insulating layer 247 functioning as a dielectric layer of the capacitor 108 is provided in the layer 204. Furthermore, a conductive layer 238 functioning as the one electrode of the capacitor 108 is provided in the layer 203.

The conductive layer 238 and the back gate electrode of the OS transistor can be formed in a common process. The conductive layer 238 can be electrically connected to the transistor 103 and the transistor 104 through a plug 239a, a connection electrode 239b, and a plug 239c. Note that the plug 239c is a plug electrically connected to the conductive layer 238 at a position not illustrated in the cross section in FIG. 15A.

Figure 15B:
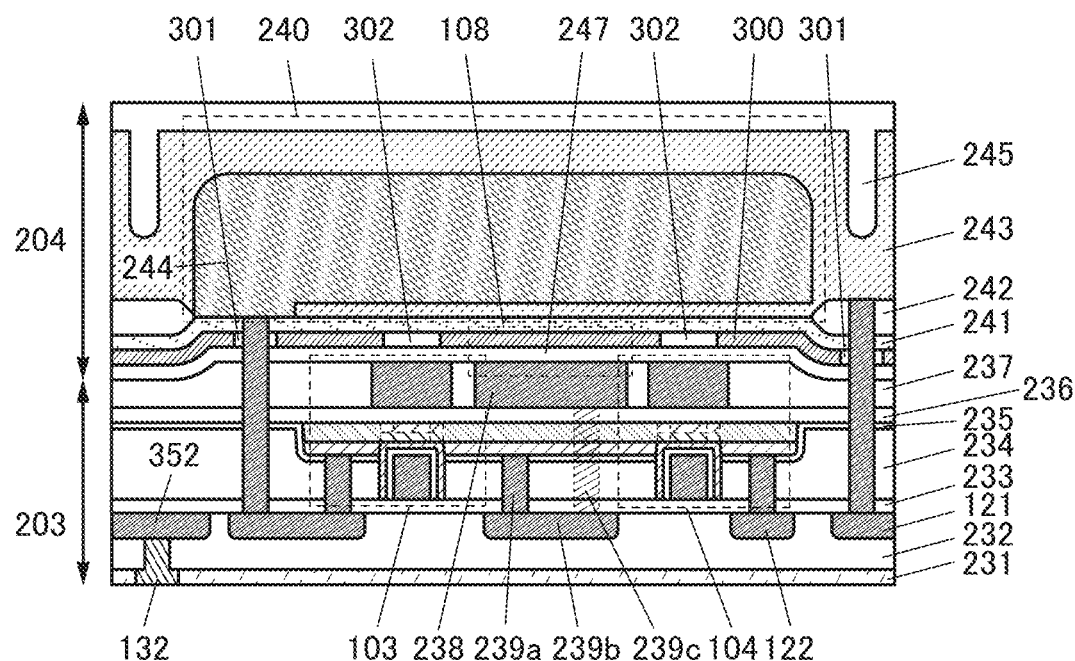

Note that parasitic capacitance is formed between the back gate of the OS transistor included in the pixel circuit 331 and the light-blocking layer 300. Thus, as illustrated in FIG. 15B, an opening portion 302 may be provided in a region of the light-blocking layer 300 overlapping with the back gate.

Modification Example 4 of Stacked-Layer Structure 1

Figure 16:
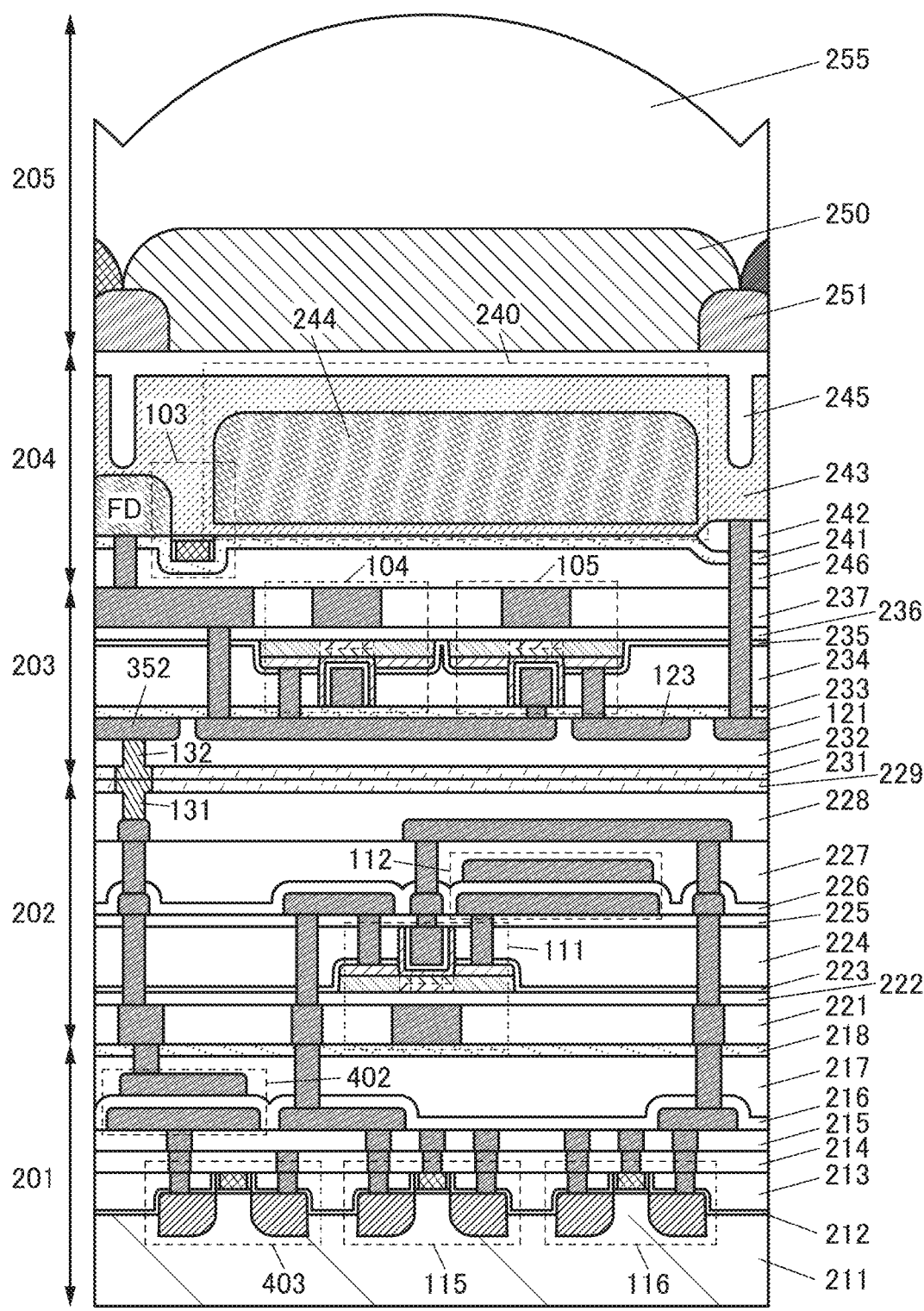
FIG. 16 is a cross-sectional view illustrating a pixel.

FIG. 16 illustrates a modification example in which the layer 203 and the layer 204 have structures different from those in the stacked-layer structure 1 illustrated in FIG. 11. The modification example 4 illustrated in FIG. 16 has a structure in which the transistor 103 included in the pixel circuit 331 is provided in the layer 204. The transistor 103 is formed of a Si transistor in the layer 204. The one of the source and the drain of the transistor 103 is directly connected to the photoelectric conversion device 240 and the other of the source and the drain of the transistor 103 functions as the node FD.

In that case, the transistors other than the transistor 103 included in the pixel circuit 331 are provided in the layer 203. The transistor 104 and the transistor 105 are illustrated in FIG. 16.

Modification Example 5 of Stacked-Layer Structure 1

Figure 17:
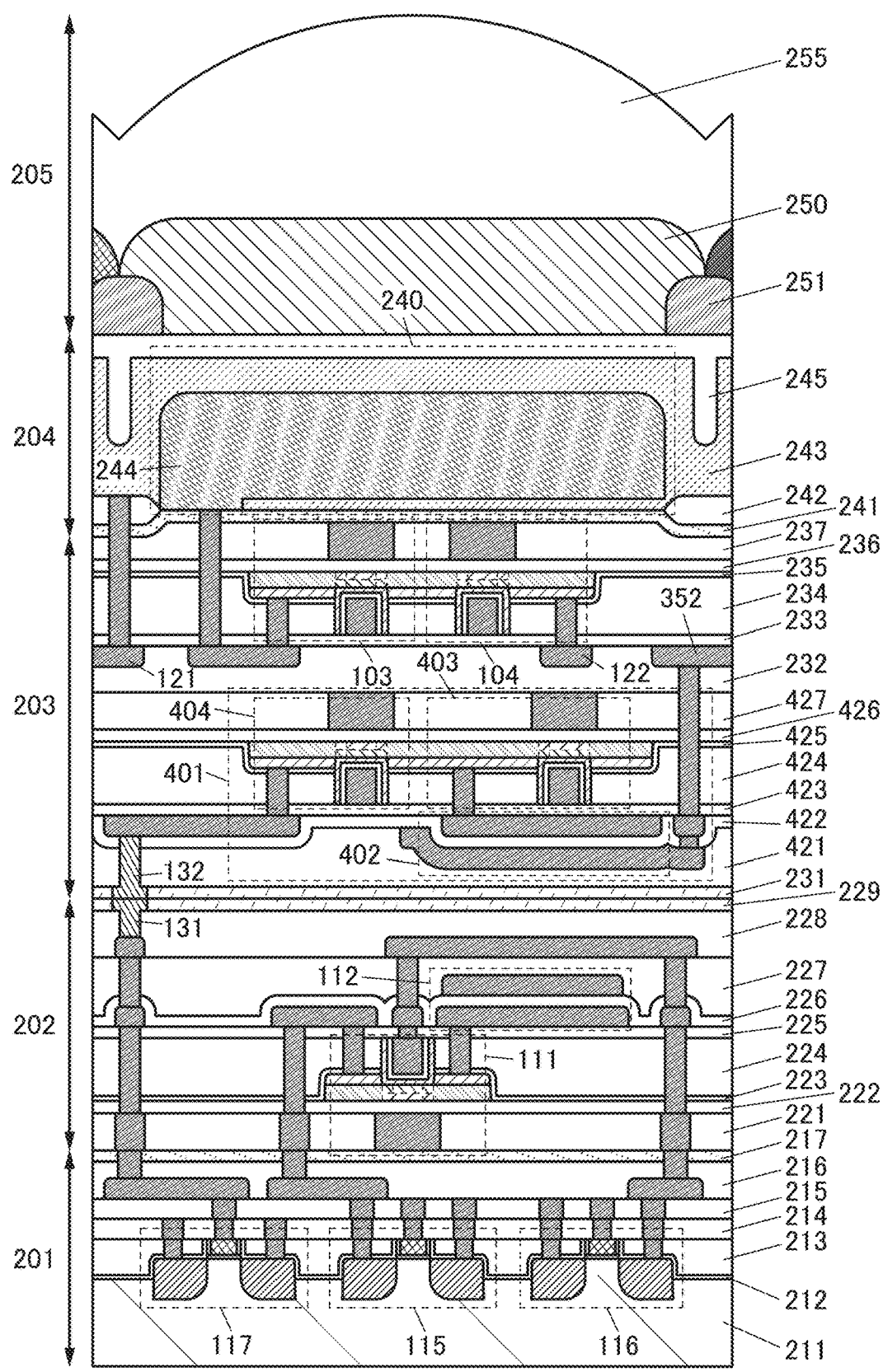
FIG. 17 is a cross-sectional view illustrating a pixel.

FIG. 17 illustrates a modification example in which the layer 201 and the layer 203 have structures different from those in the stacked-layer structure 1 illustrated in FIG. 11. The modification example 5 illustrated in FIG. 17 has a structure in which the CDS circuit 400, which is a component of the reading circuit 311, is provided in the layer 203. FIG. 17 illustrates a structure in which the CDS circuit 400 is stacked over the pixel circuit 331; however, the CDS circuit 400 may be provided on the same plane as the pixel circuit 331.

In the above case, the A/D converter 410, which is another component of the reading circuit 311, is provided in the layer 201. FIG. 17 illustrates a transistor 117 functioning as an input transistor of the A/D converter 410. A gate of the transistor 117 is electrically connected to the conductive layer 131 included in the layer 202.

The layer 203 includes the CDS circuit 400 in addition to the pixel circuit 331. Here, the capacitor 402 and the transistors 403 and 404, which are components of the CDS circuit 400, are illustrated. The transistors 403 and 404 can be formed of OS transistors. Insulating layers 421, 422, 423, 424, 425, 426, and 427 are provided in the layer 203.

The insulating layers 421, 423, 424, and 427 function as interlayer insulating films and planarization films. The insulating layer 422 functions as a dielectric layer of the capacitor 402. The insulating layer 425 functions as a protective layer. The insulating layer 426 functions as a gate insulating film.

The other electrode of the capacitor 402 is electrically connected to the wiring 352 to which the pixel circuit 331 is connected, and the one electrode of the capacitor 402 is electrically connected to the one of the source and the drain of the transistor 403 and the one of the source and the drain of the transistor 404. The other of the source and the drain of the transistor 404 is connected to the conductive layer 132. The conductive layer 132 is bonded to the conductive layer 131 included in the layer 202, whereby the CDS circuit 400 can be electrically connected to the A/D converter 410.

<Stacked-Layer Structure 2>

Figure 18:
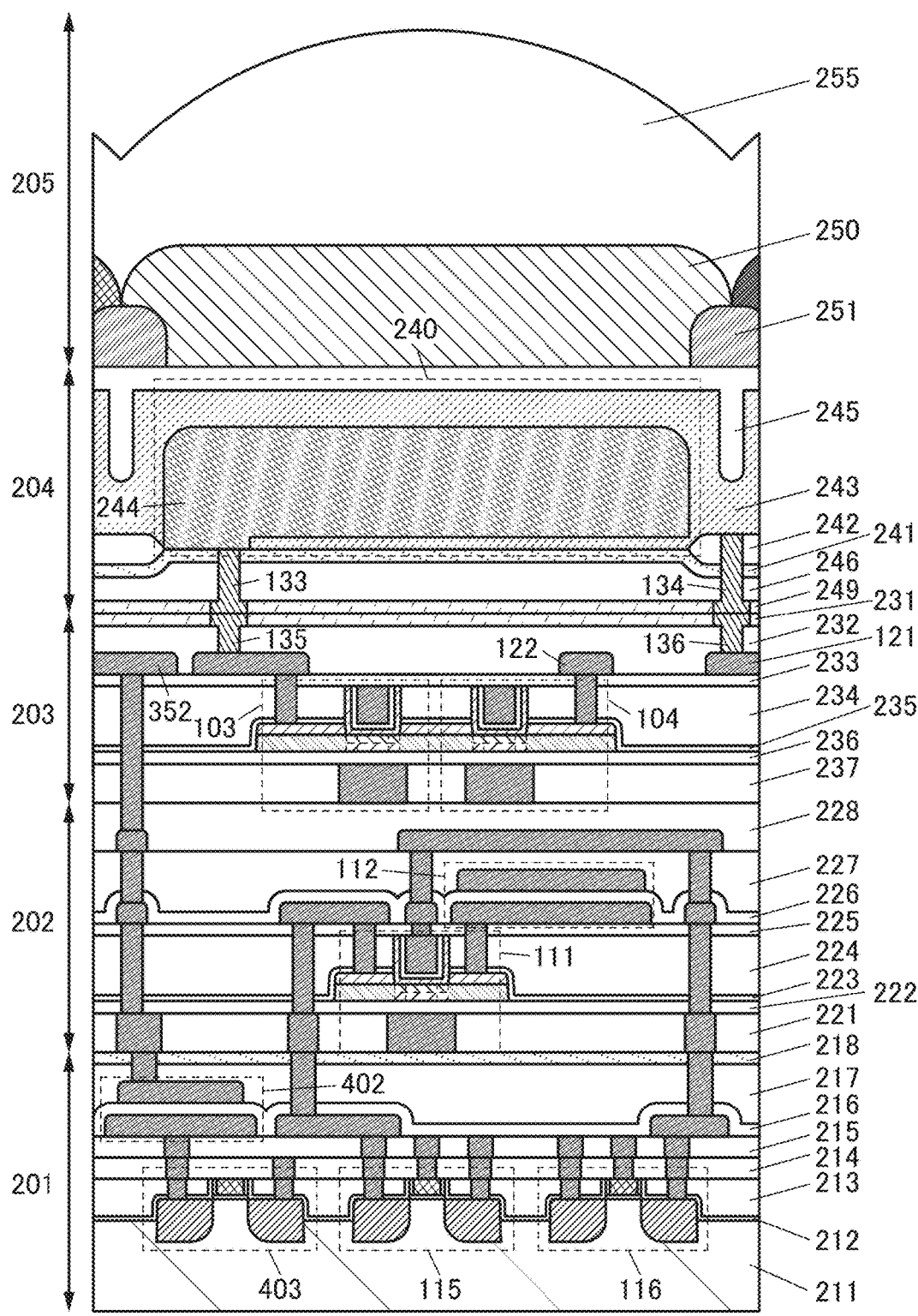
FIG. 18 is a cross-sectional view illustrating a pixel.

The structure in which the layer 202 and the layer 203 are bonded to each other is described in each of the stacked-layer structure 1 and its modification examples; however, bonding may be performed between other layers. A stacked-layer structure 2 illustrated in FIG. 18 is a structure in which a bonding plane is between the layer 203 and the layer 204.

In that case, a conductive layer 135 electrically connected to the one of the source and the drain of the transistor 103 is provided in the layer 203. In addition, a conductive layer 136 electrically connected to the wiring 121 is provided. The conductive layers 135 and 136 each include a region embedded in the insulating layer 231. Furthermore, the surfaces of the insulating layer 231 and the conductive layers 135 and 136 are planarized to be level with each other.

A conductive layer 133 electrically connected to the n-type region 244 (corresponding to a cathode) of the photoelectric conversion device 240 is provided in the layer 204. In addition, a conductive layer 134 electrically connected to the p-type region 243 (anode) is provided. Furthermore, an insulating layer 249 is provided over the insulating layer 246. The conductive layers 133 and 134 each include a region embedded in the insulating layer 249. Furthermore, the surfaces of the insulating layer 249 and the conductive layers 133 and 134 are planarized to be level with each other.

Here, the conductive layers 133, 134, 135, and 136 are the same bonding layers as the above-described conductive layers 131 and 132. The insulating layer 249 is the same bonding layer as the above-described insulating layers 229 and 231.

Thus, when the conductive layer 133 and the conductive layer 135 are bonded to each other, the n-type region 244 (corresponding to a cathode) of the photoelectric conversion device can be electrically connected to the one of the source and the drain of the transistor 103. In addition, when the conductive layer 134 and the conductive layer 136 are bonded to each other, the p-type region 243 (corresponding to an anode) of the photoelectric conversion device can be electrically connected to the wiring 121. When the insulating layer 231 and the insulating layer 249 are bonded to each other, electrical bonding and mechanical bonding of the layer 203 and the layer 204 can be performed.

<Stacked-Layer Structure 3>

Figure 19:
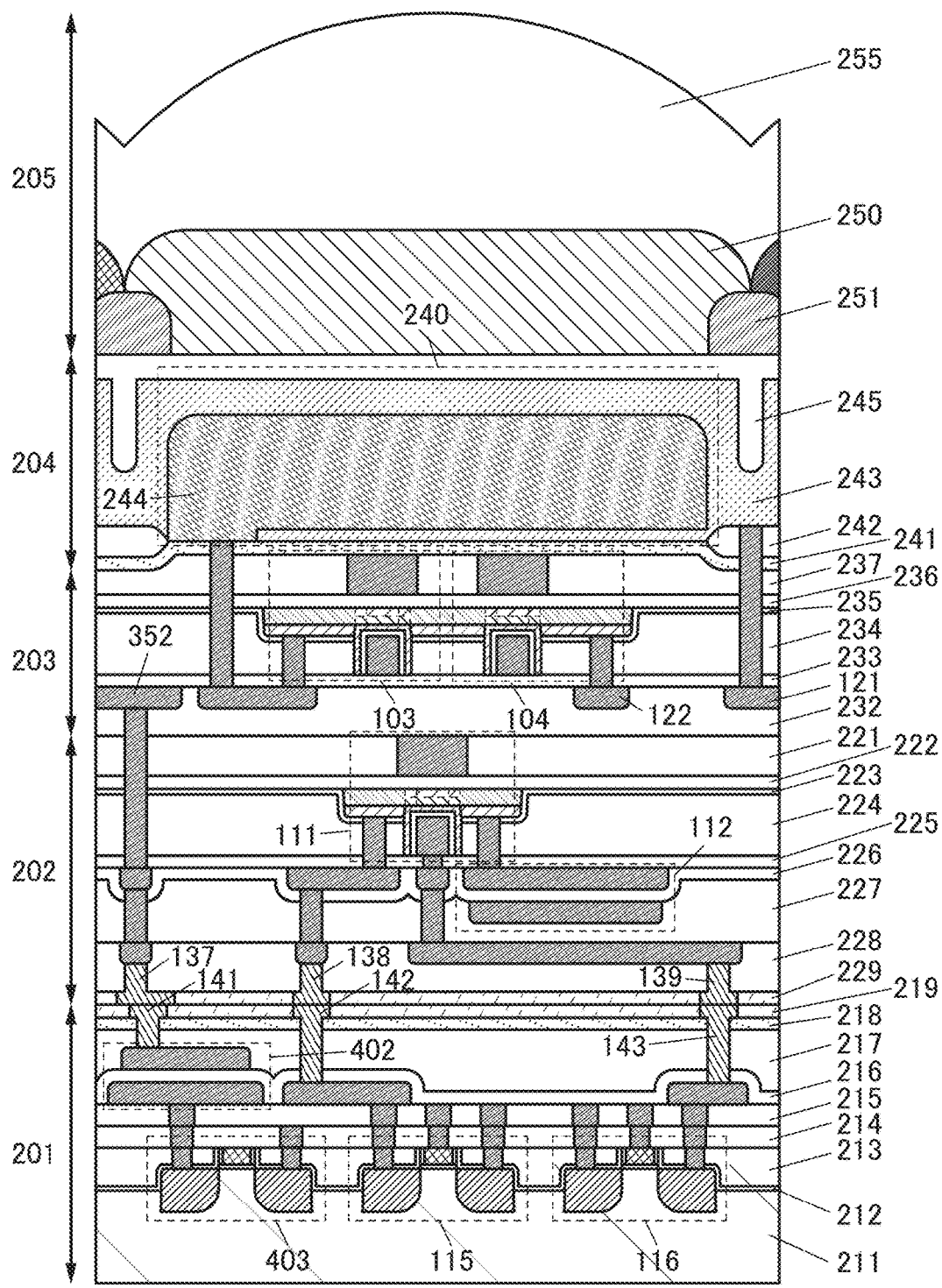
FIG. 19 is a cross-sectional view illustrating a pixel.

The stacked-layer structure 2 illustrated in FIG. 19 is a structure in which a bonding plane is between the layer 201 and the layer 202.

In that case, a conductive layer 141 electrically connected to the other electrode of the capacitor 402 is provided in the layer 201. In addition, a conductive layer 142 electrically connected to the one of the source and the drain of the transistor 115 is provided. Moreover, a conductive layer 143 electrically connected to the one of the source and the drain of the transistor 116 is electrically connected. An insulating layer 219 is provided over the insulating layer 218. The conductive layers 141, 142, and 143 each include a region embedded in the insulating layer 219. Furthermore, the surfaces of the insulating layer 219 and the conductive layers 141, 142, and 143 are planarized to be level with each other.

A conductive layer 137 electrically connected to the wiring 352 included in the layer 203 is provided in the layer 202. In addition, a conductive layer 138 electrically connected to the one of the source and the drain of the transistor 111 included in the layer 202 is provided. Furthermore, a conductive layer 139 electrically connected to the gate of the transistor 111 is provided. The conductive layers 137, 138, and 139 each include a region embedded in the insulating layer 229. Furthermore, the surfaces of the insulating layer 229 and the conductive layers 137, 138, and 139 are planarized to be level with each other.

Here, the conductive layers 137, 138, 139, 141, 142, and 143 are the same bonding layers as the above-described conductive layers 131 and 132. The insulating layer 219 is the same bonding layer as the above-described insulating layers 229 and 231.

Thus, when the conductive layer 137 and the conductive layer 141 are bonded to each other, the reading circuit 311 can be electrically connected to the pixel circuit 331. When the conductive layer 138 and the conductive layer 142 are bonded to each other, the column driver 313 can be electrically connected to the memory circuit 321. When the conductive layer 139 and the conductive layer 143 are bonded to each other, the row driver 312 can be electrically connected to the memory circuit 321.

Note that although this embodiment shows the structure in which the reading circuit of the pixel circuit and the driver circuit of the memory circuit are provided in the layer 201 and the memory circuit is provided in the layer 202, the present invention is not limited thereto. For example, a driver circuit of a pixel circuit, a neural network, a communication circuit, a CPU, or the like may be provided in the layer 201 or the layer 202.

A normally-off CPU (also referred to as "Noff-CPU") can be formed using an OS transistor and a Si transistor. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

<Stacked-Layer Structure 4>

Figure 20A:
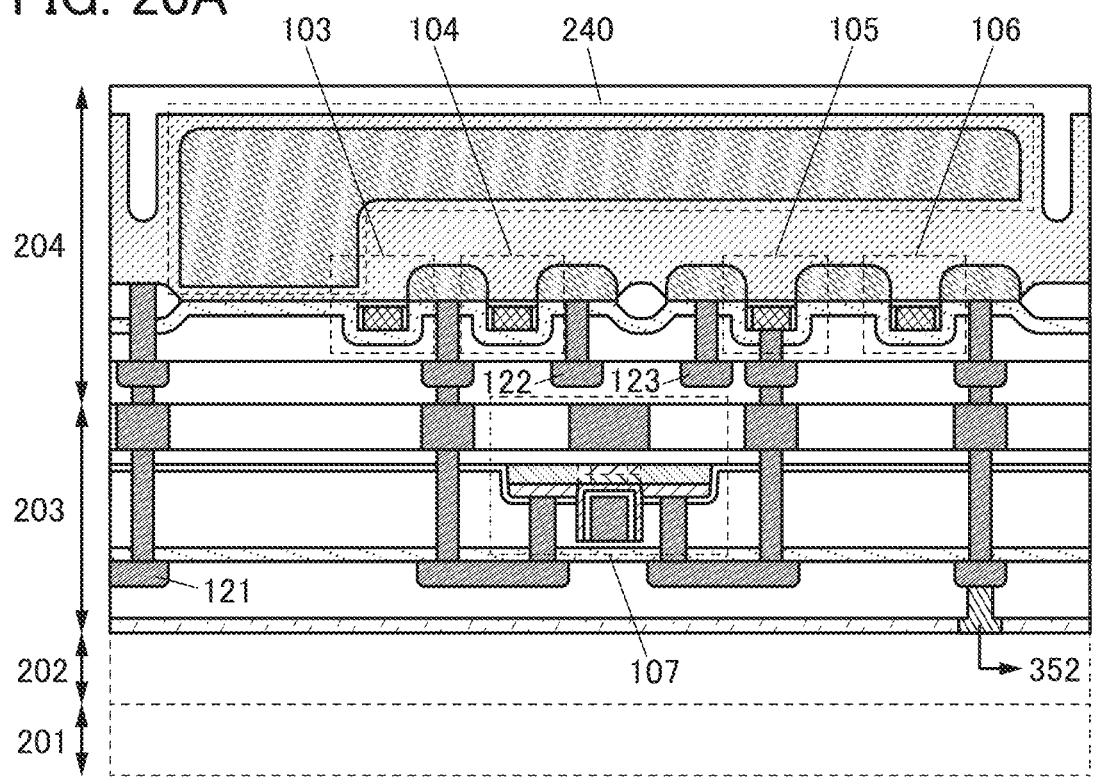
FIG. 20A and FIG. 20B are cross-sectional views illustrating pixels.

In the case where the transistor 107 is an OS transistor and the other transistors are Si transistors in the pixel circuit 331 illustrated in FIG. 4C, a structure illustrated in FIG. 20A can be employed. FIG. 20A illustrates a structure example in which the transistors 103, 104, 105, and 106 that are Si transistors are provided in the layer 204 and the transistor 107 that is an OS transistor is provided in the layer 203. The layer 203 illustrated in FIG. 20A can be connected to the circuit included in the layer 202 as in the other stacked-layer structures. Alternatively, without providing the layer 202, the layer 203 may be connected to the circuit included in the layer 201.

Figure 20B:
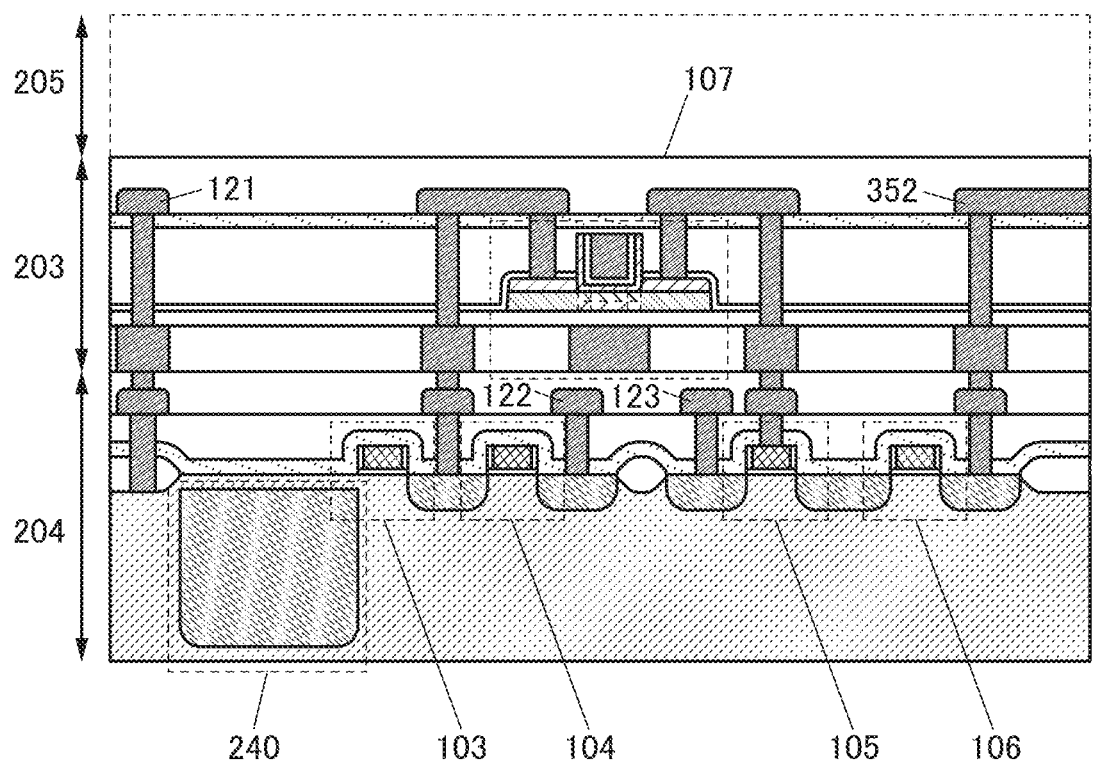

The pixel circuit 331 illustrated in FIG. 4C may have a stacked-layer structure illustrated in FIG. 20B. The stacked-layer structure illustrated in FIG. 20B is a structure in which light is emitted to the photoelectric conversion device 240 from the wiring side. Although having a lower light use efficiency, the structure has an advantage of a high degree of process flexibility. Note that the layer 205 is stacked over the layer 203 in the structure illustrated in FIG. 20B.

Figure 21:
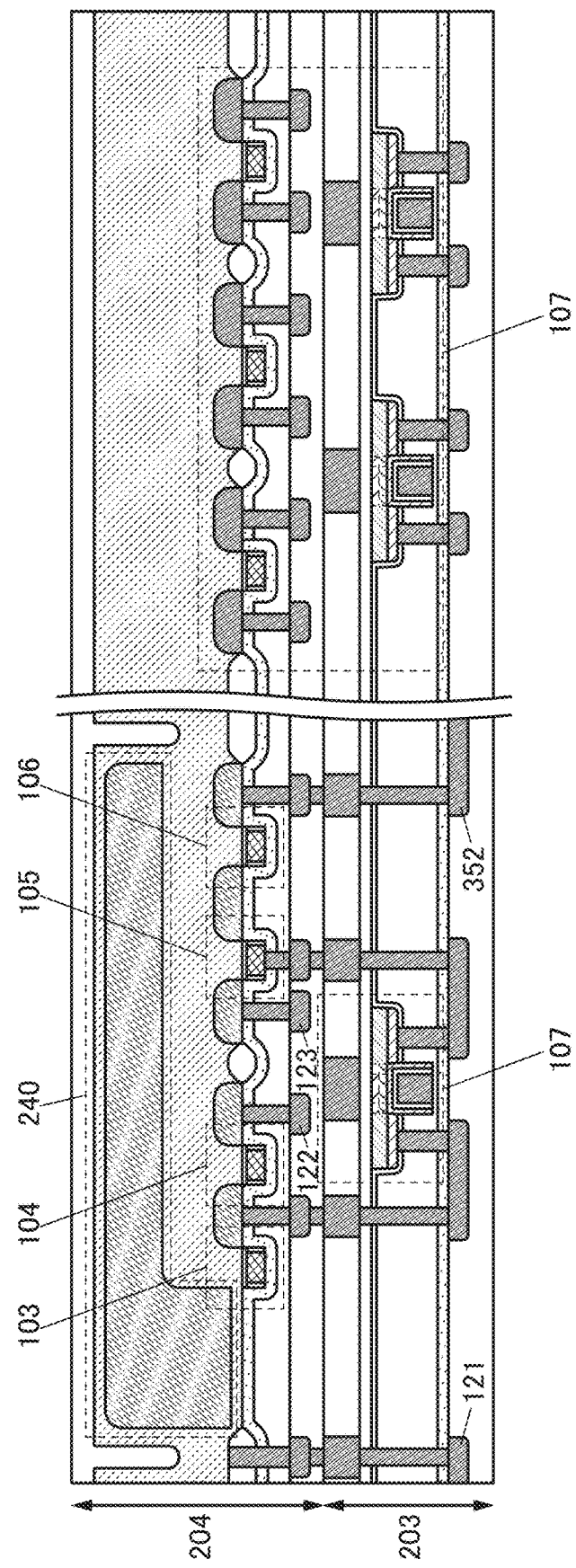
FIG. 21 is a cross-sectional view illustrating a pixel.

One embodiment of the present invention may have a stacked-layer structure illustrated in FIG. 21. The stacked-layer structure illustrated in FIG. 21 shows the pixel circuit 331 illustrated in FIG. 4C and the driver circuit 332 provided outside a pixel array. The driver circuit 332 has a structure including a Si transistor and an OS transistor but may have a structure including either Si transistors or OS transistors. In this structure, a bonding step can be omitted.

<Organic Photoelectric Conversion Device>

Figure 22:
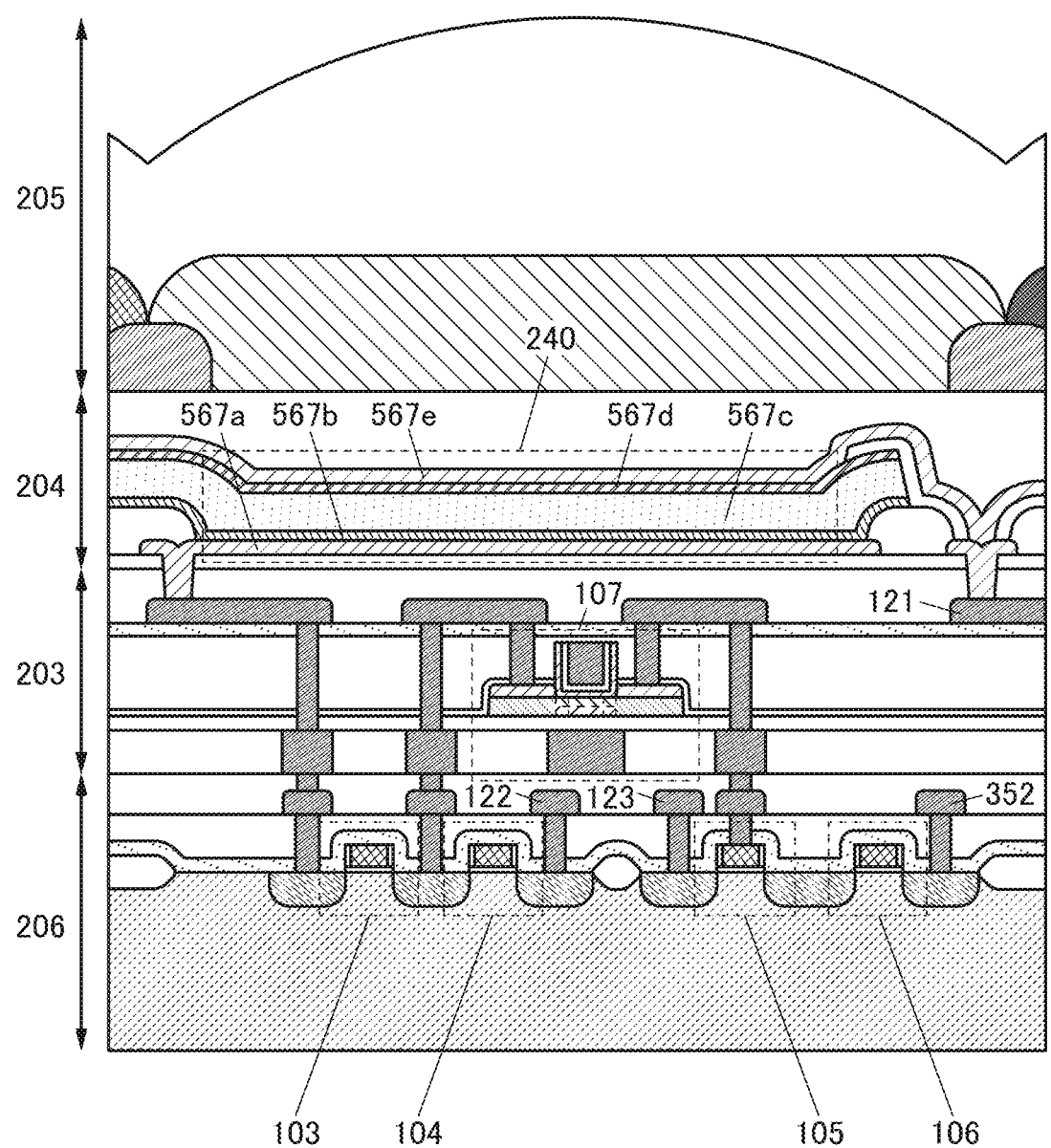
FIG. 22 is a cross-sectional view illustrating a pixel.

In one embodiment of the present invention, as the photoelectric conversion device, an organic photoelectric conversion device can be used instead of the Si photodiode. The photoelectric conversion device 240 illustrated in FIG. 22 shows an example of an organic optical conductive film; a layer 567a is a lower electrode, a layer 567e is an upper electrode having a light-transmitting property, and layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (bulk heterojunction structure) can be used.

Note that FIG. 22 illustrates the structure of the pixel circuit 331 illustrated in FIG. 4C; in this case, the transistors 103, 104, 105, and 106 can be provided on a silicon substrate included in a layer 206. In this structure, a bonding step can be omitted.

This embodiment can be combined with any of the other embodiments and examples as appropriate.

Embodiment 2

In this embodiment, examples of a package and a camera module in each of which an image sensor chip is placed are described. For the image sensor chip, the structure of the imaging device of one embodiment of the present invention can be used.

FIG. 23A1 is an external perspective view of the top surface side of a package in which an image sensor chip is placed. The package includes a package substrate 610 to which an image sensor chip 650 is fixed, a cover glass 620, an adhesive 630 for bonding them, and the like.

FIG. 23A2 is an external perspective view of the bottom surface side of the package. A BGA (Ball grid array) in which solder balls are used as bumps 640 on the bottom surface of the package is employed. Note that, without being limited to the BGA, an LGA (Land grid array), a PGA (Pin Grid Array), or the like may be employed.

FIG. 23A3 is a perspective view of the package, in which parts of the cover glass 620 and the adhesive 630 are not illustrated. Electrode pads 660 are formed over the package substrate 610, and the electrode pads 660 and the bumps 640 are electrically connected to each other via through-holes. The electrode pads 660 are electrically connected to the image sensor chip 650 through wires 670.

FIG. 23B1 is an external perspective view of the top surface side of a camera module in which an image sensor chip is placed in a package with a built-in lens. The camera module includes a package substrate 611 to which an image sensor chip 651 is fixed, a lens cover 621, a lens 635, and the like. Furthermore, an IC chip 690 having functions of a driver circuit, a signal conversion circuit, and the like of the imaging device is provided between the package substrate 611 and the image sensor chip 651; thus, the structure as an SiP (System in package) is included.

FIG. 23B2 is an external perspective view of the bottom surface side of the camera module. A QFN (Quad flat no-lead package) structure in which lands 641 for mounting are provided on the bottom surface and side surfaces of the package substrate 611 is employed. Note that this structure is only an example, and a QFP (Quad flat package) or the above-mentioned BGA may also be provided.

FIG. 23B3 is a perspective view of the module, in which parts of the lens cover 621 and the lens 635 are not illustrated. The lands 641 are electrically connected to electrode pads 661, and the electrode pads 661 are electrically connected to the image sensor chip 651 or the IC chip 690 through wires 671.

The image sensor chip placed in a package having the above form can be easily mounted on a printed substrate or the like, and the image sensor chip can be incorporated into a variety of semiconductor devices and electronic devices.

This embodiment can be combined with any of the other embodiments and examples as appropriate.

Embodiment 3

As electronic devices that can include the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIG. 24A to FIG. 24F.

Figure 24A:
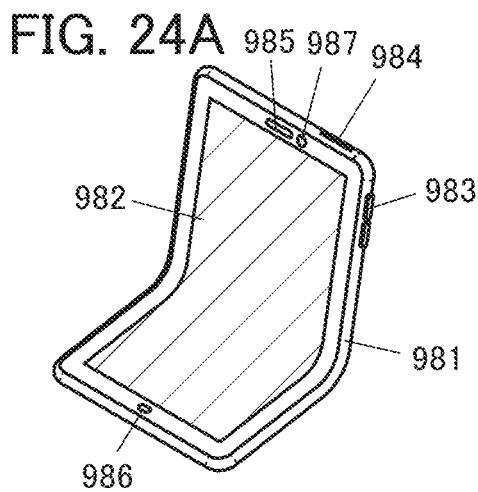
FIG. 24A to FIG. 24F are diagrams illustrating electronic devices.

FIG. 24A is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention and the operation method thereof can be used for obtaining an image in the mobile phone.

Figure 24B:
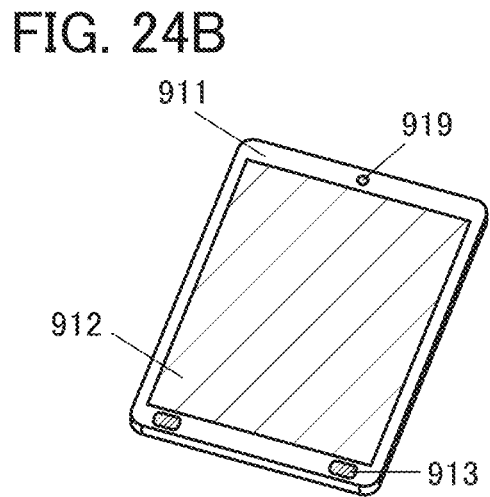

FIG. 24B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used for obtaining an image in the portable data terminal.

Figure 24C:
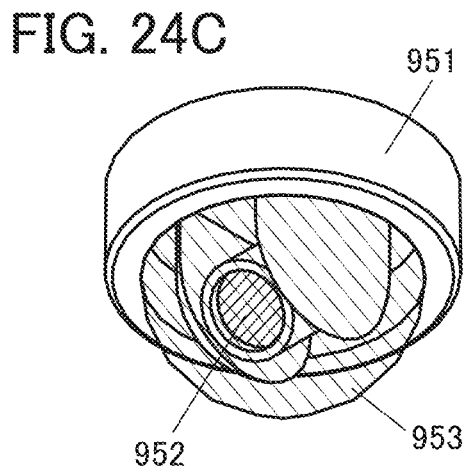

FIG. 24C is a surveillance camera, which includes a support base 951, a camera unit 952, a protection cover 953, and the like. By providing the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

Figure 24D:
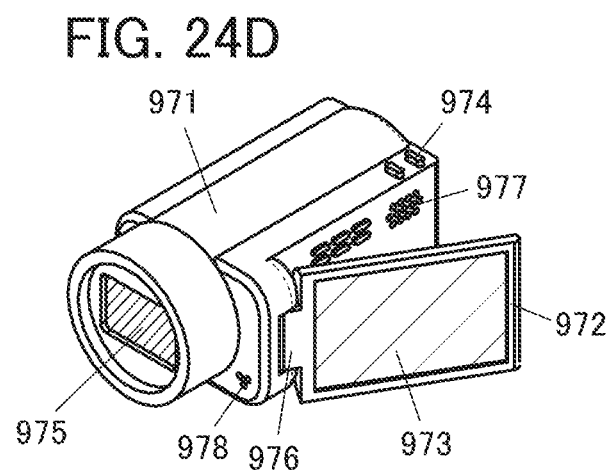

FIG. 24D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used for obtaining an image in the video camera.

Figure 24E:
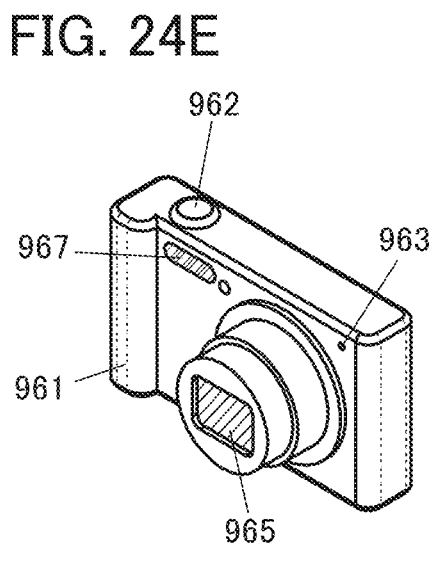

FIG. 24E is a digital camera, which includes a housing 961, a shutter button 962, a microphone 963, a light-emitting portion 967, a lens 965, and the like. The imaging device of one embodiment of the present invention and the operation method thereof can be used for obtaining an image in the digital camera.

Figure 24F:
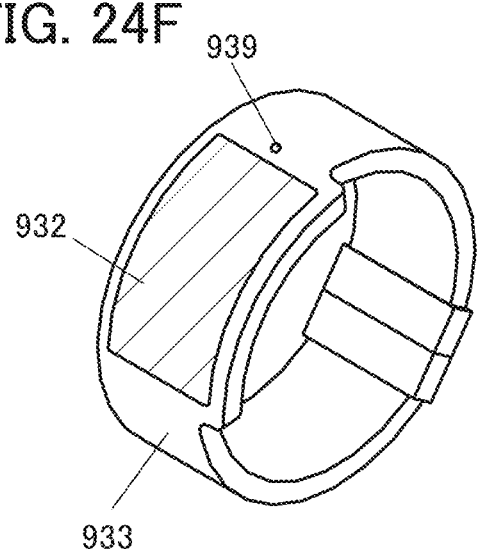

FIG. 24F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used for obtaining an image in the information terminal.

This embodiment can be combined with any of the other embodiments and examples as appropriate.

REFERENCE NUMERALS

102: transistor, 103: transistor, 104: transistor, 105: transistor, 106: transistor, 107: transistor, 108: capacitor, 111: transistor, 112: capacitor, 115: transistor, 116: transistor, 117: transistor, 121: wiring, 122: wiring, 123: wiring, 126: wiring, 127: wiring, 128: wiring, 129: wiring, 131: conductive layer, 132: conductive layer, 133: conductive layer, 134: conductive layer, 135: conductive layer, 136: conductive layer, 137: conductive layer, 138: conductive layer, 139: conductive layer, 141: conductive layer, 142: conductive layer, 143: conductive layer, 201: layer, 202: layer, 203: layer, 204: layer, 205: layer, 206: layer, 210: region, 211: silicon substrate, 212: insulating layer, 213: insulating layer, 214: insulating layer, 215: insulating layer, 216: insulating layer, 217: insulating layer, 218: insulating layer, 219: insulating layer, 220: region, 221: insulating layer, 222: insulating layer, 223: insulating layer, 224: insulating layer, 225: insulating layer, 226: insulating layer, 227: insulating layer, 228: insulating layer, 229: insulating layer, 230: region, 231: insulating layer, 232: insulating layer, 233: insulating layer, 234: insulating layer, 235: insulating layer, 236: insulating layer, 237: layer, 238: conductive layer, 239a: plug, 239b: connection electrode, 239c: plug, 240: photoelectric conversion device, 241: insulating layer, 242: insulating layer, 243: p-type region, 244: n-type region, 245: insulating layer, 246: insulating layer, 247: insulating layer, 249: insulating layer, 250: optical conversion layer, 251: light-blocking layer, 255: microlens array, 300: light-blocking layer, 301: opening portion, 302: opening portion, 311: circuit, 312: row driver, 313: column driver, 321: memory circuit, 321a: memory cell, 321aA: memory cell, 321aB: memory cell, 321aC: memory cell, 321aD: memory cell, 331: pixel circuit, 332: driver circuit, 351: wiring, 352: wiring, 353: wiring, 354: wiring, 355: wiring, 400: CDS circuit, 401: transistor, 402: capacitor, 403: transistor, 404: transistor, 405: capacitor, 410: A/D converter, 421: insulating layer, 422: insulating layer, 423: insulating layer, 424: insulating layer, 425: insulating layer, 426: insulating layer, 427: insulating layer, 431: wiring, 432: wiring, 535: back gate, 545: semiconductor layer, 546: insulating layer, 567a: layer, 567b: layer, 567c: layer, 567d: layer, 567e: layer, 610: package substrate, 611: package substrate, 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 690: IC chip, 701: gate electrode, 702: gate insulating film, 703: source region, 704: drain region, 705: source electrode, 706: drain electrode, 707: oxide semiconductor layer, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera.

The invention claimed is:

1. An imaging device comprising:
    a first circuit comprising a reading circuit, the reading circuit comprising a first transistor comprising silicon in a channel formation region;
    a first insulating layer over the first circuit;
    a second circuit comprising a plurality of memory cells arranged in a matrix over the first insulating layer, each of the plurality of memory cells comprising a second transistor comprising a first metal oxide in a channel formation region;
    a second insulating layer over the second circuit;
    a third insulating layer over and in direct contact with the second insulating layer;
    a first conductive layer comprising a region embedded in the second insulating layer and the third insulating layer;
    a fourth insulating layer over and in direct contact with the third insulating layer;
    a fifth insulating layer over and in direct contact with the fourth insulating layer;
    a second conductive layer comprising a region embedded in the fourth insulating layer and the fifth insulating layer;
    a third circuit comprising a part of a pixel circuit over the fifth insulating layer, the part of the pixel circuit comprising a third transistor comprising a second metal oxide in a channel formation region;
    a sixth insulating layer over the third circuit; and
    a photoelectric conversion device over the sixth insulating layer, wherein the photoelectric conversion device is electrically connected to the part of the pixel circuit, wherein the pixel circuit is electrically connected to the second conductive layer, wherein the second conductive layer is in direct contact with the first conductive layer, wherein the first conductive layer is electrically connected to the reading circuit, wherein the reading circuit is electrically connected to the plurality of memory cells, and wherein the reading circuit is configured to read out analog data from the pixel circuit, convert the analog data into digital data, and output the digital data to the plurality of memory cells.

2. The imaging device according to claim 1, wherein the photoelectric conversion device is a photodiode comprising silicon in a photoelectric conversion layer.

3. The imaging device according to claim 1, wherein each of the first metal oxide and the second metal oxide comprises In, Zn, and M (M is one or more of Al, Ti, Ga, Ge, Sn, Y, Zr, La, Ce, Nd, and Hf).

4. The imaging device according to claim 1, wherein the first conductive layer and the second conductive layer comprise a same metal material, and wherein the third insulating layer and the fourth insulating layer comprise a same insulating material.

5. The imaging device according to claim 1, wherein the reading circuit further comprises a first capacitor over the first transistor and under the first insulating layer, and wherein each of the plurality of memory cells further comprises a second capacitor over the second transistor and under the second insulating layer.

6. The imaging device according to claim 1, further comprising a light-blocking layer, wherein the light-blocking layer is provided between the photoelectric conversion device and the third circuit.

7. The imaging device according to claim 1, further comprising:

a row driver and a column driver each configured to drive the plurality of memory cells, wherein the fourth circuit row driver and the column driver are provided on a same substrate as the reading circuit, and wherein the row driver comprises a transistor comprising silicon in a channel formation region.

8. The imaging device according to claim 1, wherein the pixel circuit comprises the photoelectric conversion device, the third transistor, a fourth transistor, a fifth transistor, a sixth transistor, a seventh transistor, and a third capacitor, wherein one of a source and a drain of the sixth transistor is electrically connected to one electrode of the photoelectric conversion device, wherein the other of the source and the drain of the sixth transistor is electrically connected to one of a source and a drain of the seventh transistor and one of a source and a drain of the third transistor, wherein the other of the source and the drain of the third transistor is electrically connected to a gate of the fourth transistor and one electrode of the third capacitor, and wherein one of a source and a drain of the fourth transistor is electrically connected to one of a source and a drain of the fifth transistor.

9. The imaging device according to claim 8, wherein at least one of the fourth transistor, the fifth transistor, the sixth transistor, and the seventh transistor comprises silicon in a channel formation region.

10. The imaging device according to claim 1, wherein each of the first metal oxide and the second metal oxide comprises at least In.

11. An electronic device comprising:
the imaging device according to claim 1; and
a display portion,
wherein the display portion is capable of displaying an image taken with the imaging device.

12. An imaging device comprising:
a first layer comprising a reading circuit, the reading circuit comprising a first transistor comprising silicon in a channel formation region;
a second layer on the first layer, the second layer comprising:
  a plurality of memory cells arranged in a matrix, each of the plurality of memory cells comprising a second transistor comprising a first metal oxide in a channel formation region;
  a first insulating layer over the plurality of memory cells; and
  a first conductive layer comprising a region embedded in the first insulating layer;
a third layer on the second layer, the third layer comprising:
  a second insulating layer over and in direct contact with the first insulating layer;
  a second conductive layer comprising a region embedded in the second insulating layer and being in direct contact with the region of the first conductive layer; and
  a part of a pixel circuit over the second conductive layer, the part of the pixel circuit comprising a third transistor comprising a second metal oxide in a channel formation region; and
a fourth layer on the third layer, the fourth layer comprising a photoelectric conversion device included in the pixel circuit, wherein the photoelectric conversion device is electrically connected to the third transistor, wherein the pixel circuit in the third layer is electrically connected to the reading circuit in the first layer via the second conductive layer and the first conductive layer, wherein the reading circuit in the first layer is electrically connected to the plurality of memory cells in the second layer, and wherein the reading circuit is configured to read out analog data from the pixel circuit, convert the analog data into digital data, and output the digital data to the plurality of memory cells.

13. The imaging device according to claim 12, wherein the photoelectric conversion device is a photodiode comprising silicon in a photoelectric conversion layer.

14. The imaging device according to claim 12, wherein each of the first metal oxide and the second metal oxide comprises In, Zn, and M (M is one or more of Al, Ti, Ga, Ge, Sn, Y, Zr, La, Ce, Nd, and Hf).

15. The imaging device according to claim 12, wherein each of the first metal oxide and the second metal oxide comprises at least In.

16. The imaging device according to claim 12, wherein the first conductive layer and the second conductive layer comprise a same metal material, and wherein the first insulating layer and the second insulating layer comprise a same insulating material.

17. The imaging device according to claim 12,
wherein the reading circuit further comprises a first capacitor over the first transistor, and
wherein each of the plurality of memory cells further comprises a second capacitor over the second transistor and under the first insulating layer.

18. The imaging device according to claim 12,
wherein the first layer further comprises a column driver and a row driver for driving the plurality of memory cells, and
wherein the row driver comprises a transistor comprising silicon in a channel formation region.

19. The imaging device according to claim 12,
wherein the part of the pixel circuit comprises the third transistor, a fourth transistor, a fifth transistor, a sixth transistor, and a third capacitor.

20. An imaging device comprising:
a first layer comprising a reading circuit, a row driver, and a column driver, each of the reading circuit and the row driver comprising a first transistor comprising silicon in a channel formation region;
a second layer on the first layer, the second layer comprising:
  a plurality of memory cells arranged in a matrix, each of the plurality of memory cells comprising a second transistor comprising a first metal oxide in a channel formation region;
  a first insulating layer over the plurality of memory cells; and
  a first conductive layer comprising a region embedded in the first insulating layer;
a third layer on the second layer, the third layer comprising:
  a second insulating layer over and in direct contact with the first insulating layer;
  a second conductive layer comprising a region embedded in the second insulating layer and being in direct contact with the region of the first conductive layer; and
  a part of a pixel circuit over the second conductive layer, the part of the pixel circuit comprising a third transistor comprising a second metal oxide in a channel formation region; and
a fourth layer on the third layer, the fourth layer comprising a photoelectric conversion device included in the pixel circuit,
wherein each of the row driver and the column driver is configured to drive the plurality of memory cells,
wherein the photoelectric conversion device is electrically connected to the third transistor,
wherein the pixel circuit is electrically connected to the reading circuit via the second conductive layer and the first conductive layer, and
wherein the reading circuit is configured to read out analog data from the pixel circuit, convert the analog data into digital data, and output the digital data to the plurality of memory cells.

* * * * *